US012040460B2

(12) United States Patent
Books et al.

(10) Patent No.: US 12,040,460 B2
(45) Date of Patent: Jul. 16, 2024

(54) BATTERY CHARGING AND DISCHARGING OF MULTIPLE PACKS AT DIFFERENT STATES OF CHARGE (SOCs)

(71) Applicants: Cummins Inc., Columbus, IN (US); Pramod Suresh Magadi, Indianapolis, IN (US)

(72) Inventors: Martin T. Books, Columbus, IN (US); Pramod Suresh Magadi, Indianapolis, IN (US); Erik L. Piper, Columbus, IN (US); John P. O'Brien, Columbus, IN (US); Duane J. Szymanski, Columbus, IN (US); Bradford K. O. Palmer, Ham Lake, MN (US); Subbarao Varigonda, Columbus, IN (US); Jaroslaw Leonarski, Columbus, IN (US); Joseph E. Paquette, Columbus, IN (US); Carl A. Jones, Columbus, IN (US)

(73) Assignee: CUMMINS INC., Columbus, IN (US)

( * ) Notice: Subject to any disclaimer, the term of this patent is extended or adjusted under 35 U.S.C. 154(b) by 804 days.

(21) Appl. No.: 17/059,095

(22) PCT Filed: Oct. 25, 2019

(86) PCT No.: PCT/US2019/058087
§ 371 (c)(1),
(2) Date: Nov. 25, 2020

(87) PCT Pub. No.: WO2020/086973
PCT Pub. Date: Apr. 30, 2020

(65) Prior Publication Data
US 2021/0226267 A1    Jul. 22, 2021

Related U.S. Application Data

(60) Provisional application No. 62/751,023, filed on Oct. 26, 2018.

(51) Int. Cl.
*H01M 10/44* (2006.01)
*B60L 53/62* (2019.01)
(Continued)

(52) U.S. Cl.
CPC .......... *H01M 10/441* (2013.01); *B60L 53/62* (2019.02); *G01R 31/382* (2019.01); *H02J 7/0018* (2013.01); *H02J 7/0048* (2020.01)

(58) Field of Classification Search
CPC .................................................. H01M 10/441
(Continued)

(56) References Cited

U.S. PATENT DOCUMENTS 4,424,491 A    1/1984  Bobbett et al.
5,175,531 A   12/1992  Whitmire et al.
(Continued)

FOREIGN PATENT DOCUMENTS

CN    107921880 A    4/2018
TW    I662756    *  4/2018    ............... H02J 7/10
(Continued)

OTHER PUBLICATIONS

International Preliminary Report on Patentability received for PCT Patent Application No. PCT/US2019/058087, mailed on Nov. 12, 2020, 8 pages.
(Continued)

*Primary Examiner* — Edward Tso
*Assistant Examiner* — Ahmed H Omar
(74) *Attorney, Agent, or Firm* — Faegre Drinker Biddle & Reath LLP

(57) ABSTRACT

The present disclosure provides a method of selectively charging or discharging a system with multiple battery packs connected in parallel when at least one of the battery packs has a significantly different voltage or states of charge (SOCs) than the other battery packs. The method includes
(Continued)

charging or discharging the battery pack(s) with a voltage or state of charge (SOC) farthest from a target value until the voltage(s) or SOC(s) is within a range of another battery pack at which point the battery packs may be connected and charging or discharging can resume for the set of connected packs. This process is repeated until all the battery packs are at a predetermined minimum or maximum voltage or SOC threshold. The present disclosure also provides a method for selectively operating and charging at least one of a plurality of battery packs depending on the respective states of the battery packs.

20 Claims, 17 Drawing Sheets

(51) Int. Cl.
  *G01R 31/382* (2019.01)
  *H02J 7/00* (2006.01)
(58) Field of Classification Search
  USPC .................................................. 320/118–119
  See application file for complete search history.

(56) References Cited

U.S. PATENT DOCUMENTS

| | | | |
|---|---|---|---|
| 8,089,249 | B2 | 1/2012 | Zhang et al. |
| 8,532,854 | B2 | 9/2013 | Tate, Jr. et al. |
| 8,933,667 | B2 | 1/2015 | Park et al. |
| 9,236,749 | B2 | 1/2016 | Gibbs et al. |
| 2011/0127962 | A1* | 6/2011 | Murao ................. H02J 7/0016 320/118 |
| 2011/0140662 | A1 | 6/2011 | Li |
| 2011/0221394 | A1 | 9/2011 | Shigemizu et al. |
| 2012/0313439 | A1 | 12/2012 | Yamaguchi et al. |
| 2012/0313560 | A1 | 12/2012 | Hambitzer et al. |
| 2015/0380952 | A1 | 12/2015 | Brandt et al. |
| 2016/0079779 | A1 | 3/2016 | Troxel et al. |
| 2016/0200214 | A1 | 7/2016 | Ishibashi |
| 2016/0276846 | A1 | 9/2016 | Kuroda et al. |
| 2018/0215268 | A1 | 8/2018 | Pfeilschifter et al. |

FOREIGN PATENT DOCUMENTS

| | | |
|---|---|---|
| WO | 2012076126 A1 | 6/2012 |
| WO | 2014/155986 A1 | 10/2014 |

OTHER PUBLICATIONS

International Search Report and Written Opinion issued by the ISA/US, Commissioner for Patents, dated Mar. 24, 2020, for International Application No. PCT/US2019/058087; 17 pages.

* cited by examiner

BATTERY CHARGING AND DISCHARGING OF MULTIPLE PACKS AT DIFFERENT STATES OF CHARGE (SOCs)

CROSS-REFERENCE TO RELATED APPLICATIONS

The present application is a National Phase filing of PCT/US2019/058087, filed Oct. 25, 2019, which claims priority to U.S. Provisional Application No. 62/751,023, filed Oct. 26, 2018, the complete disclosure of each is expressly incorporated by reference herein.

TECHNICAL FIELD OF THE PRESENT DISCLOSURE

The present invention generally relates to battery charging and discharging methods for electric vehicles, and more particularly, to a battery charging and discharging method for multiple packs at different states of charge.

BACKGROUND AND SUMMARY OF THE PRESENT DISCLOSURE

Battery packs in electric vehicles (EV) or hybrid electric vehicles (HEV) can be connected in series or parallel. When battery packs are connected in parallel, significant differences in battery pack voltages can lead to high voltage equalizing currents, and high equalizing currents may result in a difficult and/or time-consuming process to connect a battery pack to the configuration. Moreover, the voltage equalizing current may exceed the maximum battery current limits causing pack shutdown or damage.

The present disclosure provides a method of selectively charging or discharging a system with multiple battery packs connected in parallel when at least one of the battery packs has a significantly different voltage or states of charge (SOCs) than the other battery packs. The method includes charging or discharging the battery pack(s) with a voltage or state of charge farthest from a target value until the voltage or state(s) of charge is within a range of another battery pack at which point the battery packs may be connected and charging or discharging can resume for the set of connected packs. This process is repeated until all the battery packs are at a predetermined minimum or maximum voltage or state of charge threshold of the system. In addition, the present disclosure provides a method for selectively operating and charging at least one of a plurality of battery packs depending on the respective states of the battery packs.

According to an embodiment of the present disclosure, a method of utilizing a plurality of battery packs is disclosed. The method comprising determining a failure status of a first battery pack, the first battery pack comprising a first contactor and a second contactor; and determining a failure status of a second battery pack operably coupled to the first battery pack, the second battery pack comprising a third contactor and a fourth contactor. When the first battery pack is in a failure state and the second battery pack is not in a failure state, the third contactor is placed in a closed configuration and the second contactor is placed in an open configuration so that only the second battery pack is operational. When the first battery pack is in a failure state and the second battery pack is in a failure state, the first contactor, the second contactor, the third contactor, and the fourth contactor are placed in an open configuration so that the first battery pack and the second battery pack are non-operational. When the first battery pack is not in a failure state and the second battery pack is in a failure state, the first contactor is placed in a closed configuration and the fourth contactor is placed in an open configuration so that only the first battery pack is operational.

The method may further comprise determining an absolute difference with a predetermined maximum acceptable voltage differential (dVmax) value. When the absolute difference is less than the predetermined dVmax value, the first contactor, the second contactor, the third contactor, and the fourth contactor are placed in a closed configuration so that the first battery pack and the second battery pack are operational. When the absolute difference is greater than or equal to the predetermined dVmax value, the method further comprises comparing the first voltage with the second voltage. When the first voltage is greater than the second voltage, the first contactor and the fourth contactor are placed in a closed configuration so that the first battery pack is operational and the second battery pack begins to charge. When the first voltage is less than the second voltage, the third contactor and the second contactor are placed in a closed configuration so that the second battery pack is operational and the first battery pack begins to charge. The first battery pack or the second battery pack may be charged through a resistor. The method may further comprise stopping the charge when the absolute difference is less than or equal to the predetermined dVmax value.

According to another embodiment of the present disclosure, a parallel battery configuration is disclosed. The parallel battery configuration comprises a first battery pack comprising a first main battery system contactor positioned on a negative terminal; a second main battery system contactor positioned on a positive terminal; a first high current contactor operably coupled to the first main battery system contactor and the second main battery system contactor; a second high current contactor operably coupled to the first main battery system contactor and the second main battery system contactor; a low current contactor operably coupled to the first main battery system contactor and the second main battery system contactor; and a resistor. The second battery pack comprises a third high current contactor operably coupled to the first main battery system contactor and the second main battery system contactor and configured to operably coupled the first battery pack and the second battery pack in parallel; a fourth high current contactor operably coupled to the first main battery system contactor and the second main battery system contactor; a second low current contactor operably coupled to the first main battery system contactor and the second main battery system contactor; and a resistor.

The first battery pack of the parallel battery configuration may further comprise a converter. The converter may be configured to draw an input voltage from the first battery pack and output a voltage different from the input voltage to match a voltage of the second battery pack. Closing the first main battery system contactor and the second main battery system contactor closes all other contactors. At least one of the contactors comprises a solid state switch.

Yet another embodiment of the present disclosure discloses a method of charging a plurality of battery packs, the method comprising identifying a first battery pack having a lowest voltage of a plurality of battery packs; closing a first contactor of the first battery pack; measuring a second voltage of a second battery pack of the plurality of battery packs; determining a first difference between the lowest voltage and the second voltage; and comparing the first difference to a predetermined maximum acceptable voltage differential (dVmax) value.

When the first difference is less than or equal to the dVmax value, the method further comprises closing a second contactor of the second battery pack. The method may further comprise allowing a first predetermined amount of time to pass; measuring a third voltage of the first battery pack; measuring a fourth voltage of a third battery pack of the remaining plurality of battery packs; determining a second difference between the fourth voltage and the third voltage; and comparing the second difference to a predetermined voltage value. When the second difference is less than or equal to the predetermined voltage value, the method may further comprise closing a third contactor of the third battery pack. When the first difference is greater than the dVmax value, the second battery pack and the third battery pack may be the same battery pack. The third battery pack may comprise the lowest voltage of the remaining plurality of battery packs. The method may further comprise charging the battery packs with closed contactors by providing a charge current. The charge current may be provided by methodically increasing a voltage value of the charge current until the charge current reaches a predetermined maximum charge current value.

According to another embodiment of the present disclosure, a method of discharging a plurality of battery packs is disclosed, the method comprising identifying a first battery pack having a highest voltage of a plurality of battery packs; closing a first contactor of the first battery pack; measuring a second voltage of a second battery pack of the plurality of battery packs; determining a first difference between the lowest voltage and the second voltage; and comparing the first difference to a predetermined maximum acceptable voltage differential (dVmax) value.

When the first difference is less than or equal to the dVmax value, the method may further comprise closing a second contactor of the second battery pack. The method may further comprise allowing a first predetermined amount of time to pass; measuring a third voltage of the first battery pack; measuring a fourth voltage of a third battery pack of the remaining plurality of battery packs; determining a second difference between the fourth voltage and the third voltage; and comparing the second difference to a predetermined voltage value. When the second difference is less than or equal to the predetermined voltage value, the method may further comprise closing a third contactor of the third battery pack. When the first difference is greater than the dVmax value, the second battery pack and the third battery pack may be the same battery pack. The third battery pack may comprise the highest voltage of the remaining plurality of battery packs. The method may further comprise discharging the battery packs with closed contactors by providing a discharge current. The discharge current may be provided by methodically increasing a voltage value of the discharge current until the voltage value current reaches a predetermined maximum discharge current value.

According to yet another embodiment of the present disclosure, a method of changing voltage of a plurality of battery packs is disclosed, the method comprising providing a charge current or a discharge current to at least a first battery pack of a plurality of battery packs, wherein the first battery pack includes a closed first contactor, by methodically increasing a voltage value of the charge current or the discharge current until the voltage value reaches a predetermined maximum current voltage value; measuring a first voltage of the first battery pack; measuring a second voltage of a second battery pack of the plurality of battery packs; determining a first difference between the first voltage and the second voltage; comparing the first difference to a predetermined maximum acceptable voltage differential (dVmax) value; and comparing the second voltage of the second battery pack to a system voltage.

The method may further comprise reducing the voltage value of the charge current or the discharge current until a current inflow is less than a predetermined inflow value; and closing a second contactor of the second battery pack; wherein the first difference is less than or equal to the dVmax value and the system voltage is greater than the second voltage. The method may further comprise closing a second contactor of the second battery pack wherein the first difference is less than or equal to the dVmax value and the system voltage is less than or equal to the second voltage. The second battery pack may comprise the lowest voltage of the remaining plurality of battery packs. The second battery pack may comprise the highest voltage of the remaining battery packs. The method may further comprise charging the battery packs with closed contactors. The method may further comprise discharging the battery packs with closed contactors.

According to yet another embodiment of the present disclosure, a method of changing voltage of a plurality of battery packs is disclosed, the method comprising providing a charge current or a discharge current to at least a first battery pack of a plurality of battery packs, wherein the first battery pack includes a closed first contactor; measuring a first voltage of the first battery pack; measuring a second voltage of a second battery pack of the plurality of battery packs; determining a first difference between the first voltage and the second voltage; comparing the first difference to a predetermined maximum acceptable voltage differential (dVmax) value; comparing the first difference to a predetermined maximum acceptable voltage differential (dVmax) value; comparing the second voltage of the second battery pack to a system voltage; reducing the voltage value of the charge current or the discharge current until a current inflow is less than a predetermined inflow value; and closing a second contactor of the second battery pack; wherein the first difference is less than or equal to the dVmax value and the system voltage is greater than the second voltage.

DETAILED DESCRIPTION OF THE DRAWINGS

Figure 1:
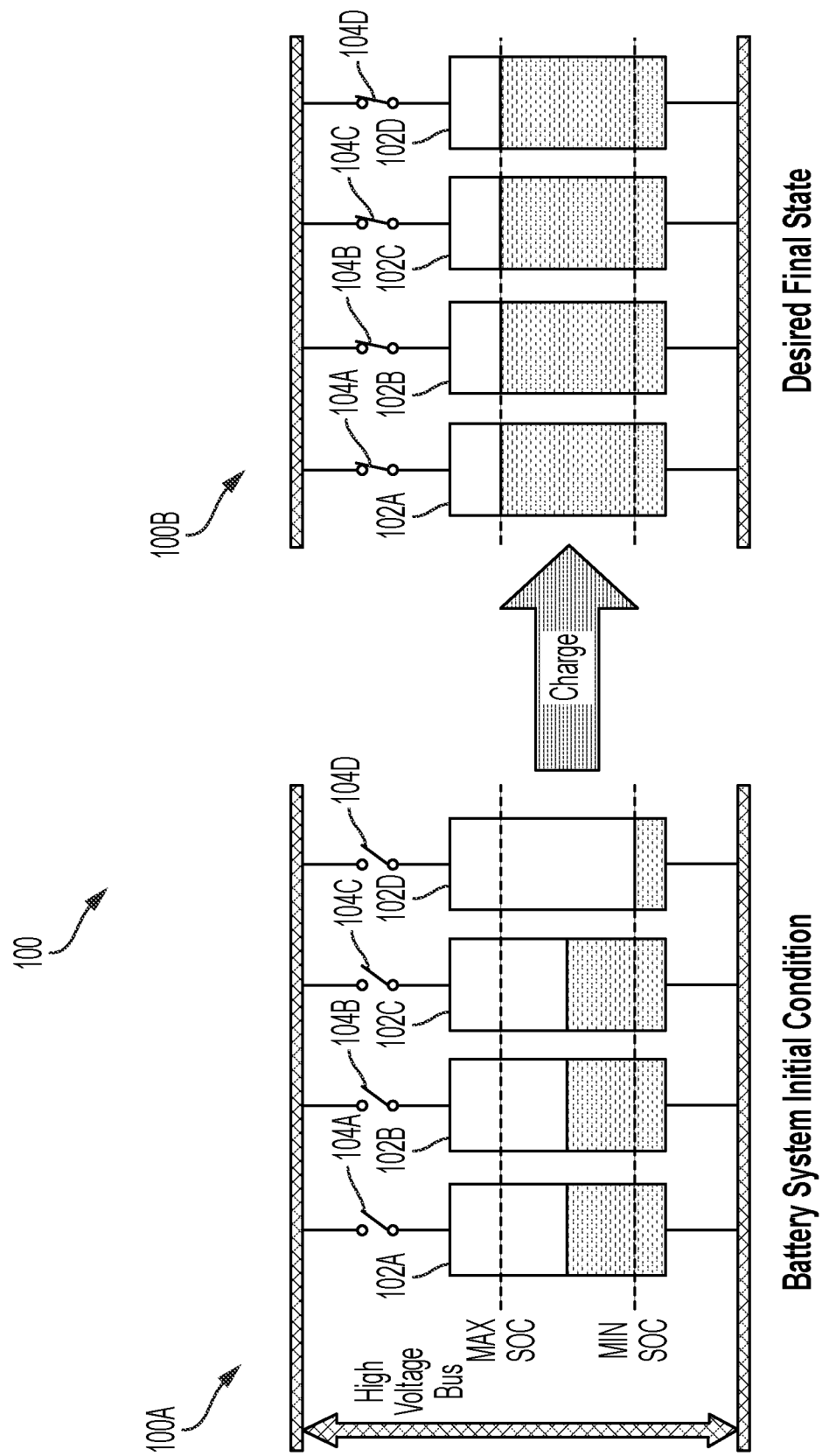
FIG. 1 is a diagram illustrating a charging process for a parallel battery configuration set forth in the present disclosure.

Referring first to FIG. 1, a battery pack system 100 showing a battery pack configuration 100A is provided. The battery pack configuration 100A includes battery packs 102A, 102B, 102C, and 102D with corresponding contactors 104A, 104B, 104C, and 104D in the open position where the battery circuits are open and inactive (i.e., current cannot flow to or from the battery packs within the circuit). The contactors 104A-D function to switch an electrical power circuit between a closed circuit and an open circuit for the corresponding battery packs 102A-D. The battery pack configuration 100A shows an initial condition of the battery pack system 100 where the battery pack 102D has a state of charge (SOC) that is substantially equal to the minimum SOC as indicated in FIG. 1 while the states of charge (SOCs) of the battery packs 102A-C are between the shown minimum SOC and the maximum SOC of FIG. 1 and are substantially equal to each other. As also shown in FIG. 1, the battery pack configuration 100A transitions to the battery pack configuration 100B via a charging method disclosed further herein. The battery pack configuration 100B includes the battery packs 102A-D each having the maximum SOC (as indicated in FIG. 1) and the contactors 104A-D in the closed position.

Figure 2B:
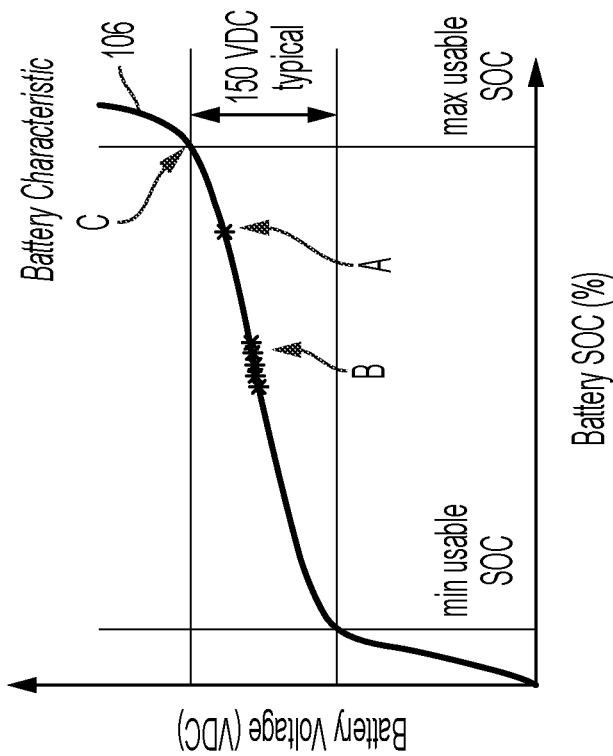
FIG. 2B is a graph illustrating a battery pack configuration in which one battery pack of the battery pack configuration is at an outlier voltage and state of charge (SOC) above the other battery packs in the battery pack configuration.
Figure 2A:
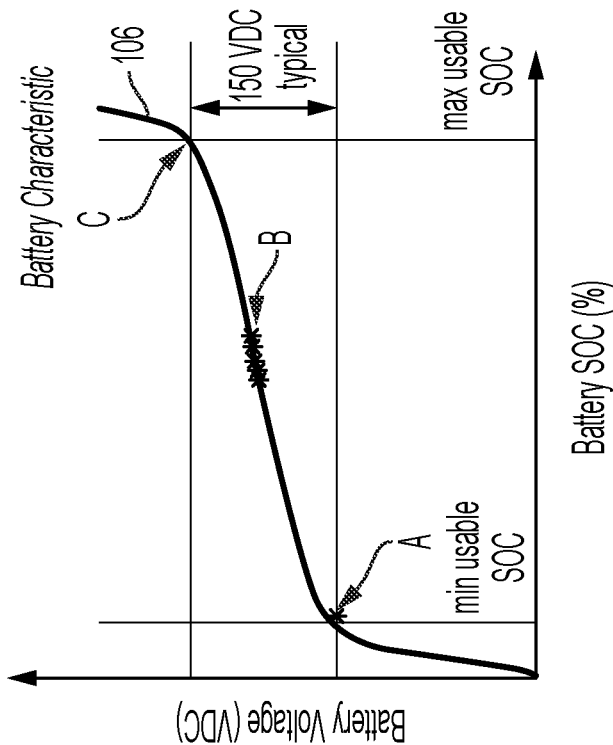
FIG. 2A is a graph illustrating a battery pack configuration in which one battery pack of the battery pack configuration is at an outlier voltage and state of charge (SOC) below the other battery packs in the battery pack configuration.
Figure 3:
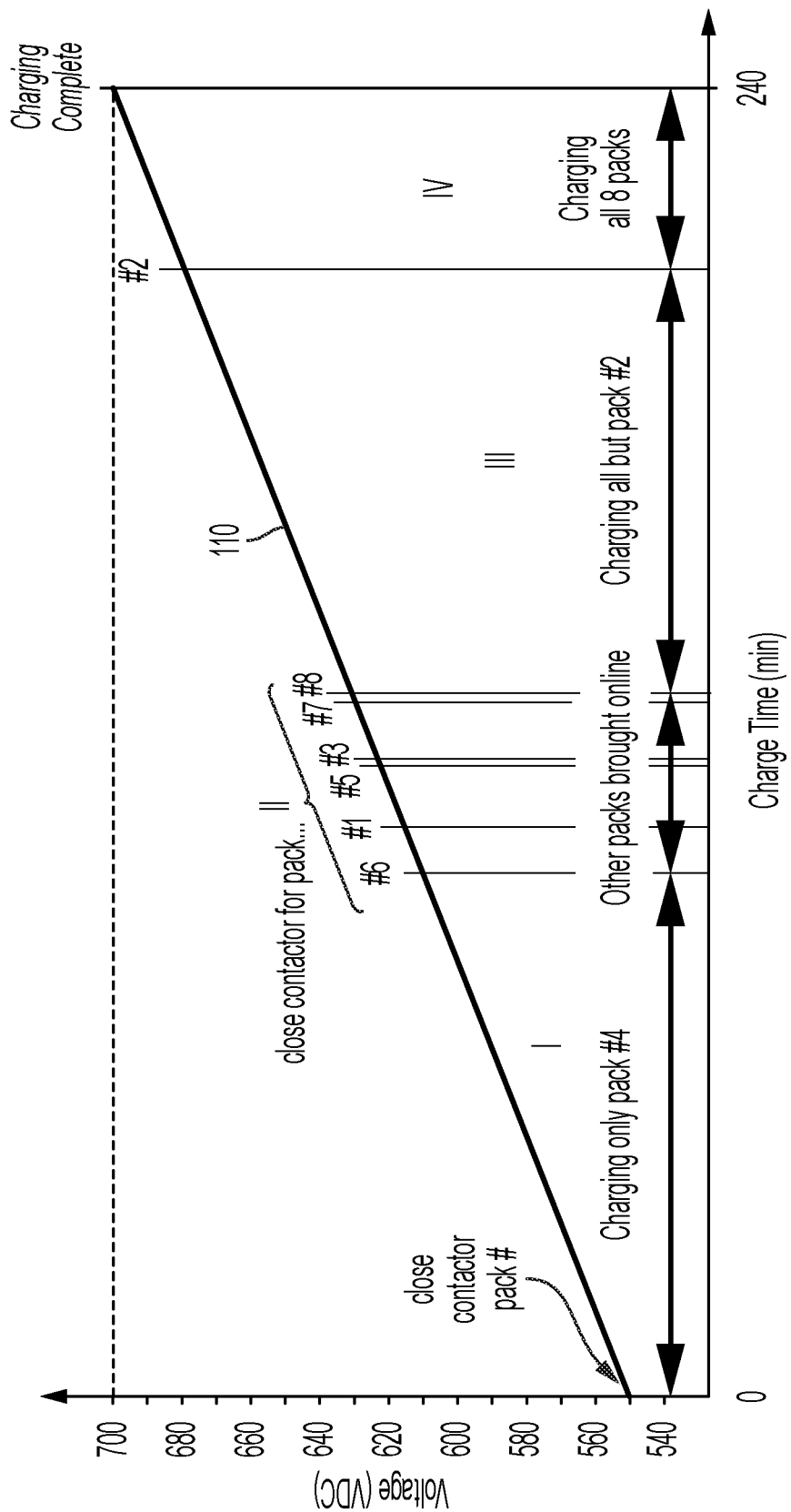
FIG. 3 is a graph illustrating embodiments of charging methods for the parallel battery pack configuration of FIG. 1.

Referring now to FIGS. 2A, 2B, and 3, a graphical representation of the charging method further described herein is shown. As shown in FIG. 2A, a battery voltage curve 106 in terms of battery SOC is provided where a battery pack (as denoted by an asterisk) is provided at region A. The battery pack has a substantially lower SOC and battery voltage as compared to the voltages and SOCs of the battery packs at region B. According to the method described herein in further detail, when charging the batteries, the battery pack at region A is charged first. As the battery pack is charged, the SOC and the voltage of the battery pack increase and move along a curve 106 towards the battery packs at region B. Once the battery pack's SOC and voltage are within a predetermined range of or substantially equal to the batteries at region B, the battery packs at region B may be connected to the previously charging pack with an acceptable equalizing current, and all packs begin to charge until the battery packs reach the maximum voltage and SOC at region C along the curve 106.

FIG. 2B shows an alternate configuration of battery packs where multiple battery packs at region B have a substantially lower battery pack voltage and SOC than the battery pack at region A. In this instance, the multiple battery packs at region B are charged first until their respective SOCs and voltages are within a predetermined range of or substantially equal to the battery pack at region A. At which point, all the battery packs are charged until the battery packs reach the maximum voltage and SOC at region C along the curve 106.

FIG. 3 illustrates a charging profile 110 and also illustrates a charging method (discussed further herein) of an embodiment of the battery system 100. As shown at time zero, a battery pack #4 has a voltage associated with position I and has the lowest voltage. As the battery pack #4 is charged, the voltage of the battery pack #4 increases along the charging profile 110 toward battery packs #6, #1, #5, #3, #7, and #8. When the voltage of the battery pack #4 is within a predetermined range of or substantially equal to the voltage of the battery pack #6, the two packs are connected and the battery pack #6 begins to charge in addition to the battery pack #4. A similar pattern follows for battery packs #1, #5, #3, #7, and #8 as these battery packs are brought online to charge at various later times or simultaneously with the other battery packs depending on the predetermined voltage range as denoted in region II.

As charging continues through region III, the battery packs #1 and #3-#8 continue to charge. When the voltage of the battery packs #1 and #3-#8 are within a predetermined range or substantially equal to the voltage of the battery pack #2, the battery pack #2 is brought online and begins to charge in conjunction with the battery packs #1, #3-8 through region IV until charging of the battery packs is complete as indicated. Because the number of battery packs being charged at any one time may vary, the electrical power and/or current between battery packs may not be constant, and therefore voltage may not climb at a constant rate as illustrated. The current and/or electrical power between battery packs will increase at a roughly proportional rate with the number of battery packs that are online, while charging at a constant current will see voltage increasing at a decreasing rate as additional battery packs are brought online.

Figure 4:
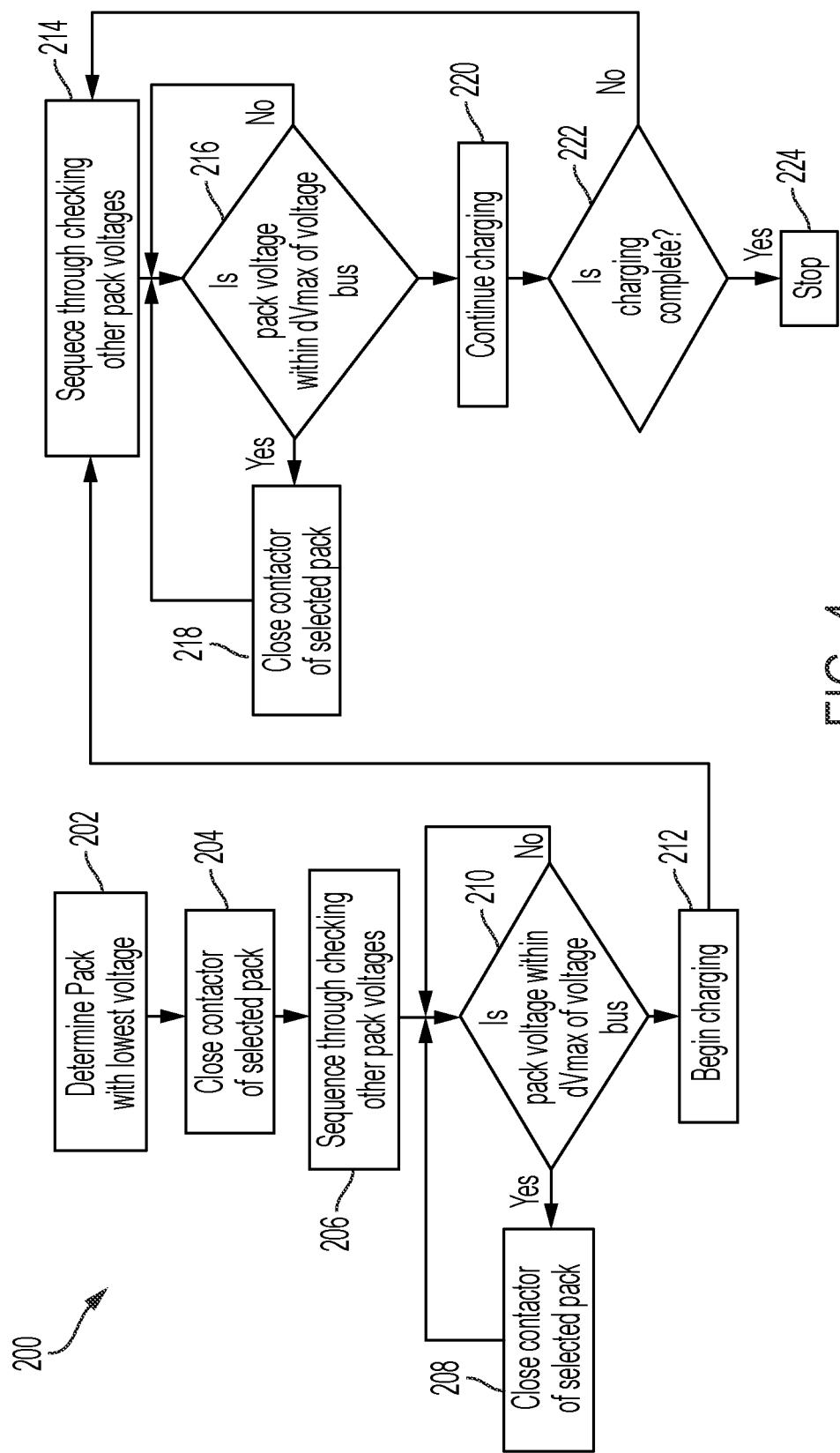
FIG. 4 is a flowchart illustrating one embodiment of a charging method for the parallel battery pack configuration of FIG. 1.

Referring now to FIG. 4, a method 200 of charging the battery pack system 100 is shown. The method 200 begins at block 202 where a battery pack with the lowest voltage is determined and selected. This can be done by an electronic control module (ECM) in one embodiment. Then, at block 204, the contactor of the selected pack is closed. The method 200 then proceeds to block 206 where the battery pack system 100 iteratively sequences through and checks the voltages of the other battery packs as discussed further herein and is shown at blocks 208 and 210.

To check the voltages of the remaining battery packs (at block 206), one of the remaining battery packs is selected and the voltage of the selected battery pack is measured. Then, at block 210, the absolute value of the difference in voltages is calculated and compared to a predetermined dVmax value, wherein the dVmax value is the maximum acceptable voltage differential to safely connect the battery packs. The dVmax value is selected with consideration to the continuous charging current capability of the battery packs, as well as the internal resistance of the battery packs. The voltages of the respective battery packs are measured at no load and with no compensation for battery internal resistance voltage drop.

As shown in block 210, if the absolute voltage difference is less than or equal to the dVmax value, then the method 200 proceeds to block 208 where the contactor of the selected pack is closed. The method 200 then proceeds back to block 206, where another battery pack is selected and compared with the voltage threshold as outlined above. Conversely, if the absolute voltage difference between the lowest voltage battery pack and the selected battery packs is greater than the dVmax value, then method 200 does not close the contactor of the selected battery pack and returns to block 206, where another battery pack is selected and compared with the dVmax value as outlined above. It is contemplated that in alternate embodiments, the dVmax value may vary depending on the vehicle operating parameters or engine configuration. The sequencing process iteratively cycles through the remaining battery packs as outlined in blocks 206, 208, and 210 until all the battery packs in the battery pack system 100 are checked.

The method 200 then proceeds to block 212 where the battery packs (selected from the process of blocks 206, 208, and 210) with closed contactors begin to charge. After a predetermined period of time allotted for charging the selected battery packs at block 212, the battery pack system 100 then sequences through the remaining battery packs via blocks 214, 216, and 218 in a similar iterative process as outlined above with respect to blocks 206, 208, and 210.

To check the voltages of the remaining battery packs at block 214, one of the remaining packs is selected and the voltage is measured. Then, at block 216, the absolute value of the difference in voltage between the selected battery pack and the voltage of the charging battery pack(s) from block 212 is calculated. The absolute voltage difference is then compared with the dVmax value. As shown in block 216, if the voltage difference is less or equal to than the dVmax value, then the method 200 proceeds to block 218 where the contactor of the selected pack is closed. The method 200 then proceeds back to block 214, where another battery pack of the remaining battery packs is selected and compared with the dVmax value as outlined above. Conversely, if the voltage difference between the charging battery pack(s) and the selected battery packs is greater than the dVmax value, then the method 200 does not close the contactor of the selected battery pack and returns to block 214 where another battery pack is selected and compared with the dVmax value as outlined above. It is contemplated that in alternate embodiments, the dVmax value may vary depending on the vehicle operating parameters or engine configuration. The sequencing process iteratively cycles through the remaining battery packs as outlined in blocks 214, 216, and 218 until all the battery packs in the battery pack system 100 are checked.

The method 200 then proceeds to block 220 where the selected packs and the previously charging packs are charged. After a predetermined time period of charging, the method 200 proceeds to block 222 where the battery pack system 100 determines whether charging is complete. In one embodiment, charging is complete when all of the battery packs of the battery pack system 100 are at the pre-established maximum SOC setting and the pre-established maximum voltage setting. If charging is complete, then the method 200 moves to block 224 where the method 200 is stopped. If charging is not complete; however, the method 200 returns to block 214 to iteratively check the remaining battery packs as outlined above.

Figure 5:
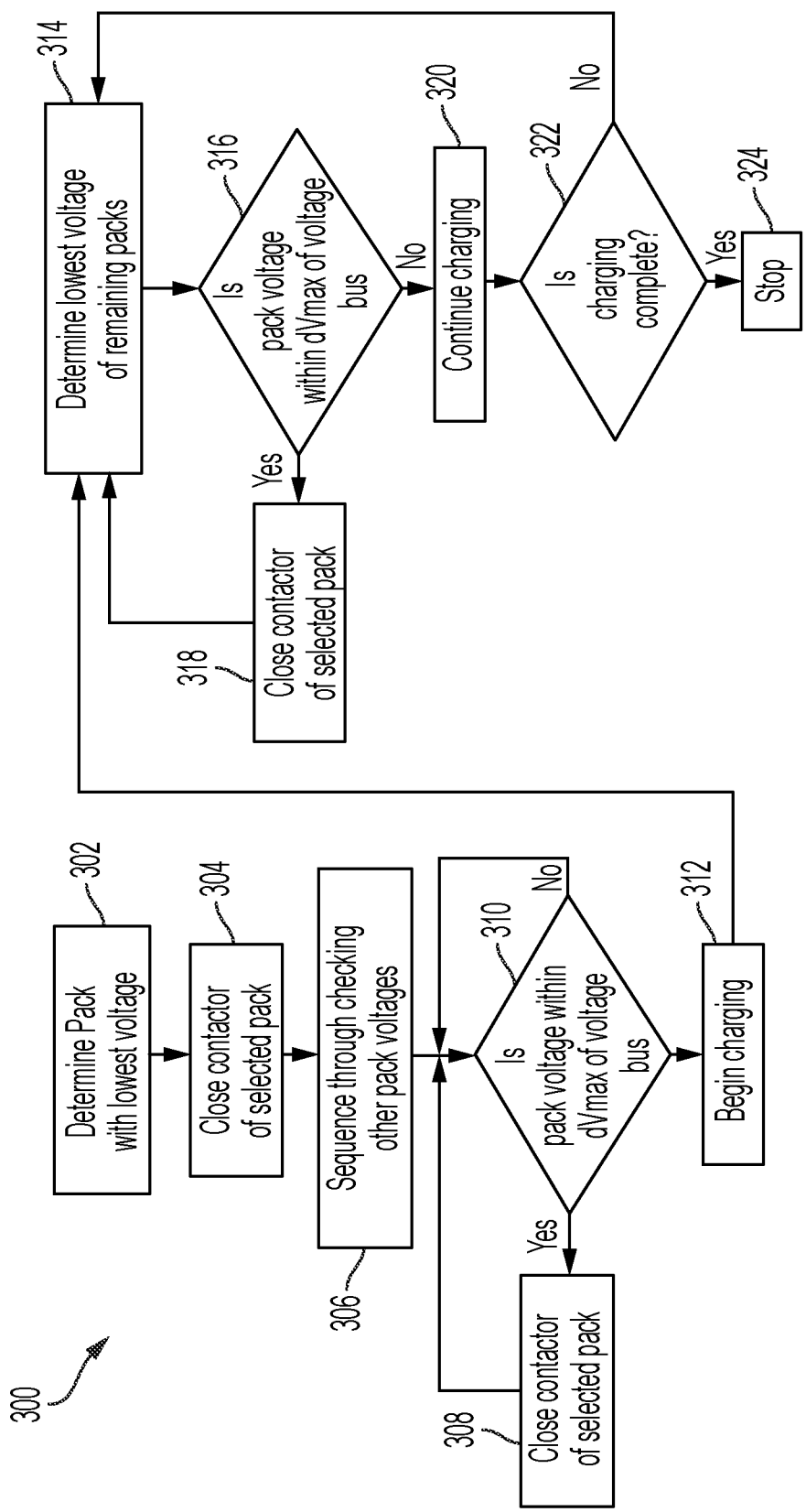
FIG. 5 is a flowchart illustrating another embodiment of a charging method for the parallel battery pack configuration of FIG. 1.

Referring now to FIG. 5, an alternative charging method 300 is shown. Method 300 is similar to the method 200 discussed above, where the difference between the methods is described further herein.

After a predetermined amount of time of charging for the selected battery pack (selected from blocks 306-310) at block 312, the battery pack system 100 cycles through and checks the voltages of the remaining battery packs and selects the battery pack having the lowest voltage. Once the lowest voltage battery pack is selected, the method 300 then proceeds to block 316 where, similar to block 216, the absolute voltage difference of the selected battery pack is and the charging battery pack(s) is calculated and compared to a predetermined dVmax value. If the voltage difference is less than or equal to the dVmax value, then the contactor of the selected pack is closed at block 318, and the method 300 returns to block 314 where the battery pack with the next lowest voltage is selected, if applicable. Conversely, if the absolute voltage difference between the selected battery pack and the voltage of the charging battery pack(s) is greater than the dVmax value, then the method 300 does not close the contactor of the selected battery pack and returns to block 314 where the battery pack with the next lowest voltage of the remaining battery packs is selected, and the absolute voltage difference is calculated and compared with the dVmax value as outlined above. The sequencing process iteratively cycles through the remaining battery packs as outlined in blocks 314, 316, and 318 until all the battery packs in the battery pack system 100 are checked.

The method 300 then proceeds to block 320 where the selected packs and the previously charging packs are charged. After a predetermined period of time allotted for charging the batteries, the method 300 proceeds to block 322 where the battery pack system 100 determines whether charging is complete. As mentioned previously, charging is complete when all the battery packs of the battery pack system 100 are at the pre-established maximum SOC setting and the pre-established maximum voltage setting. If the condition at block 322 is met, then the method 300 moves to block 324 where the method 300 is stopped. If the condition at block 322 is not met, however, the method 300 returns to block 314 to check the voltages of the remaining battery packs as outlined above.

Referring again briefly to FIG. 1, if a new battery pack 102d is installed with a large SOC disparity from the pre-existing packs 102a-102c, the charging method disclosed herein will automatically accommodate such new battery pack 102d by charging the new pack 102d without any manual intervention. Similarly, if any individual battery pack 102 fails, or an anomaly during use of a battery pack 102 causes the corresponding contactor 104 to open so that the battery pack 102 is not used for the remainder of the vehicle mission, the charging method disclosed herein will automatically bring all battery packs 102 to the same SOC without any manual intervention.

Figure 6:
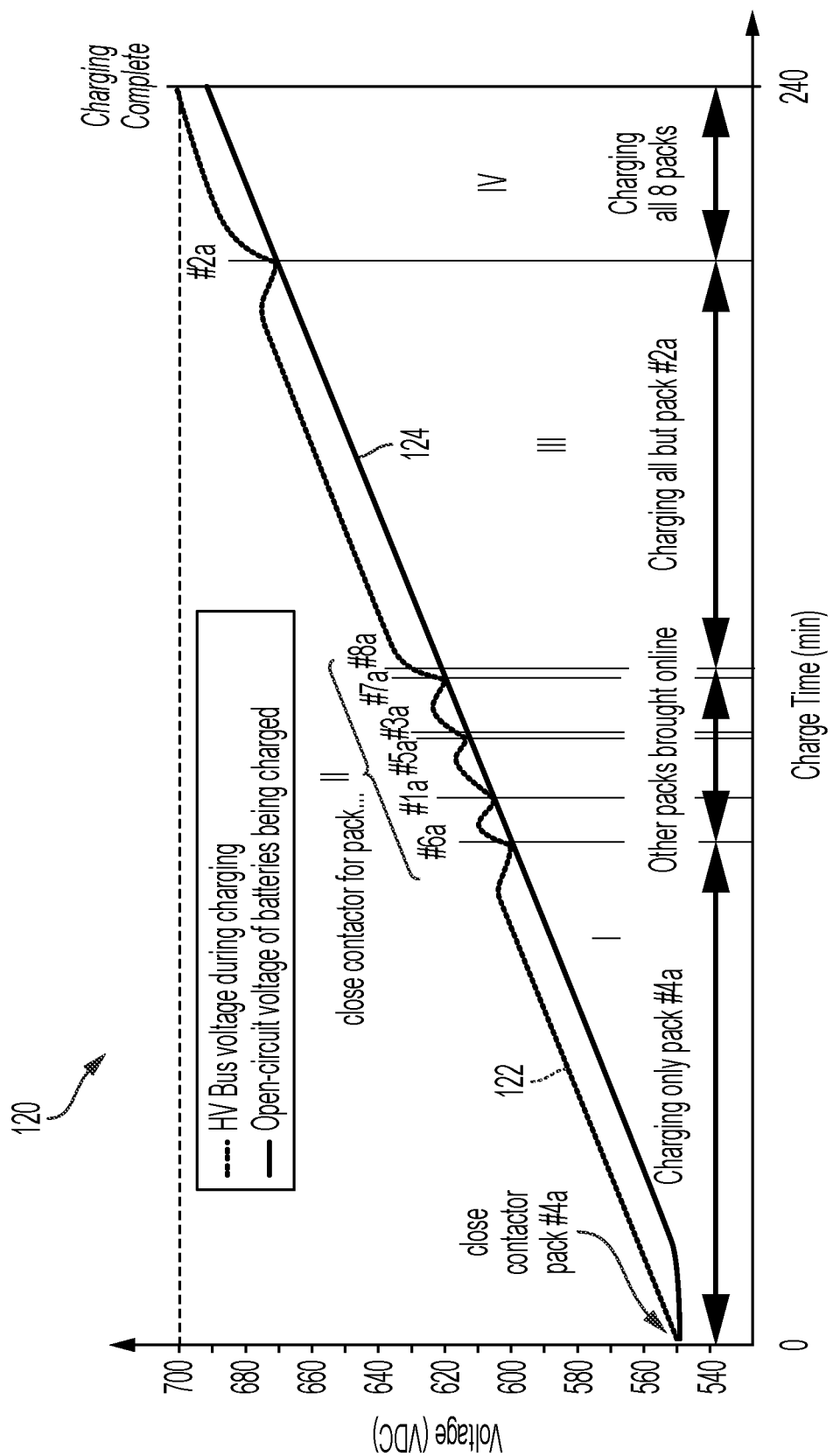
FIG. 6 is a graph illustrating an embodiment of charging methods for the parallel battery pack configuration of FIG. 1 to avoid disproportionate allocation of a charging current.

Referring to FIG. 6, in some embodiments, the voltage of the batteries is measured according to a bus voltage rather than an open circuit voltage of the individual battery. In such embodiments, battery voltage may vary depending on the amount of current being charged to or discharged from the battery, and the open circuit voltage cannot be easily and accurately calculated due to a significant amount of current inflow. In such a case, when a subsequent battery pack is brought online, it will likely not be at equilibrium with a previous pack or packs which have already undergone charging, i.e. will likely have a much higher open circuit voltage that is substantially equal to the bus voltage of the previous pack or packs. Therefore, when charging resumes, the new pack will already be at a higher potential than the previous packs, causing the new pack to receive a disproportionately low amount of a charging current and the previous packs receiving a disproportionately high amount of the charging current. The higher current may cause damage to the previous packs.

A charging profile 120 is illustrated in FIG. 6, including a charging method (discussed further herein) of an embodiment of the battery system 100 to avoid disproportionate allocation of a charging current. The charging profile 120 includes a measured bus voltage line 122 and an open circuit voltage line 124. As shown at time zero, a battery pack #4a has an open circuit voltage associated with position I, which is the lowest voltage among the battery packs shown. The battery pack #4a therefore receives the charging current to begin charging. A bus voltage is generated according to the line 122, which creates a significant disparity between the measured bus voltage and the actual open circuit voltage according to line 124. As the battery pack #4a is charged, the voltages of the battery pack #4a increase along the charging profile 120 toward battery packs #6a, #1a, #5a, #3a, #7a, and #8a.

As the measured bus voltage of the battery pack #4a approaches the voltage of the battery pack #6a, the charging current is reduced, lowering the measured bus voltage of the battery pack #4a. As the charging current approaches zero, the bus voltage approaches the open circuit voltage of battery pack #4a. When the charging current is low and the bus voltage of the battery pack #4a is within a predetermined range of or substantially equal to the voltage of the battery pack #6a, the two packs are connected and the battery pack #6a begins to charge in addition to the battery pack #4a. A similar pattern follows for battery packs #1a, #5a, #3a, #7a, and #8a as these battery packs are brought online to charge at various later times or simultaneously with the other battery packs depending on the predetermined voltage range as denoted in region II.

As charging continues through region III, the battery packs #1a and #3a-#8a continue to charge. As described above, when the measured bus voltage of the battery packs #1a and #3a-#8a are within a predetermined range or substantially equal to the voltage of the battery pack #2a, the battery pack #2a is brought online and begins to charge in conjunction with the battery packs #1a and #3-#8 through region IV until charging of the battery packs is complete as indicated.

Figure 7A:
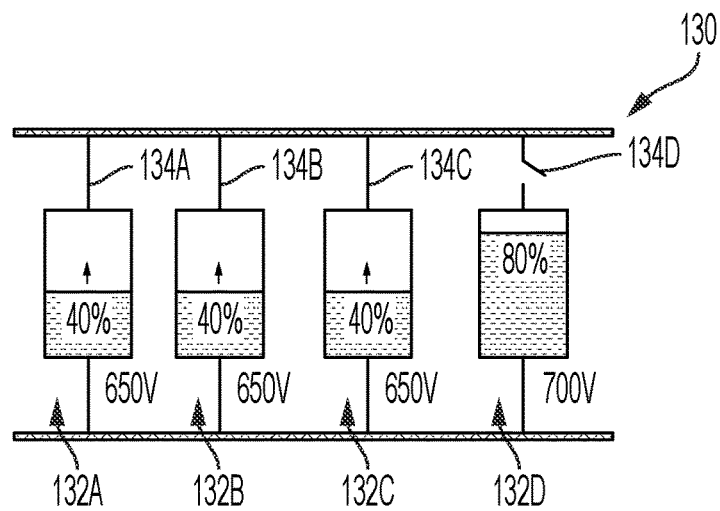
FIG. 7A is a graph illustrating a battery pack configuration in which one battery of the battery pack configuration is at an outlier voltage and state of charge (SOC) above the other battery packs in the battery configuration.
Figure 7B:
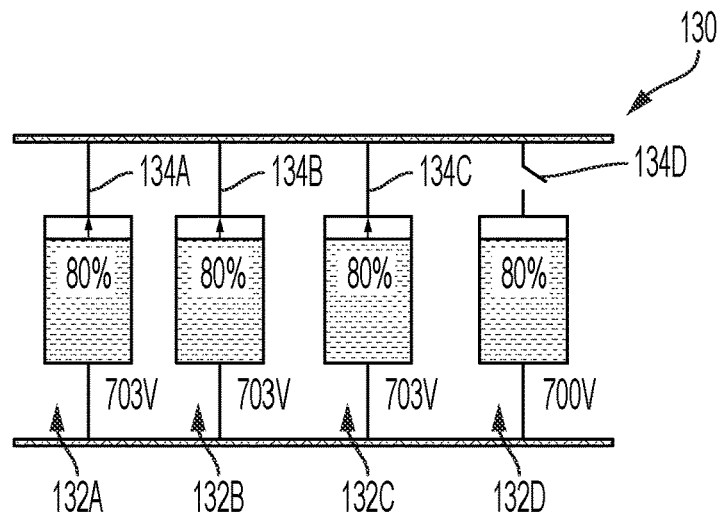
FIG. 7B is a graph illustrating a battery pack configuration in which all of the battery packs in the battery configuration have substantially the same state of charge (SOC), but one of the battery packs in the battery pack configuration has a slightly lower state of charge (SOC) compared to the other battery packs in the battery configuration.
Figure 7C:
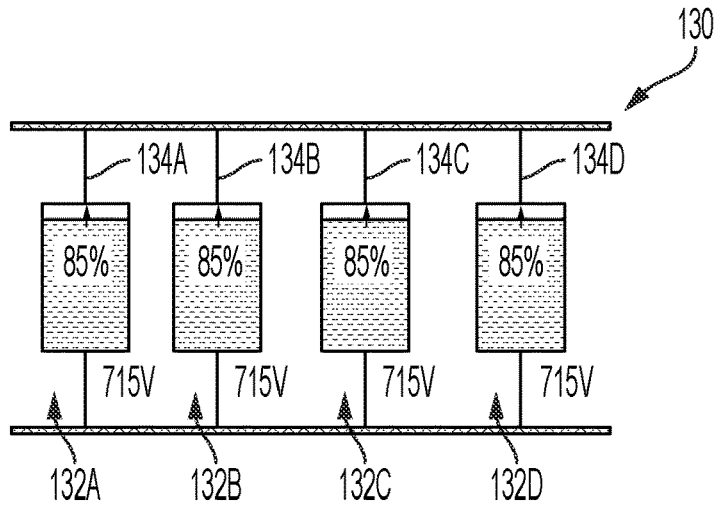
FIG. 7C is a graph illustrating a plurality of battery packs in a battery pack configuration, wherein all of the battery packs in the battery pack configuration are charging and have substantially the same state of charge (SOC)

For example, now referring to FIGS. 7A-7C, the charging method of a battery pack system 130 is shown. The battery pack system 130 includes four battery packs 132A-D with corresponding contactors 134A-D in an open position where the battery circuits are open and inactive (i.e., current cannot flow to or from the battery packs within the circuit) and in a closed position where the battery circuits are closed. The contactors 134A-D function to switch an electrical power circuit between a closed circuit and an open circuit for the corresponding battery packs 132A-D. FIG. 7A shows an initial condition of the battery pack system 130 where the battery packs 132A, 132B, and 132C have a state of charge (SOC) of approximately 40%, the contactors 134A-C of the corresponding battery packs 132A-C are closed so that the battery packs 132A-C are charging with a maximum charge current value allowed as determined by the battery pack system 130. The battery pack 132D has an SOC of approximately 80% and an open contactor 134D, so that the battery pack 132D is not charging.

As the voltages of the battery packs 132A-C approach and slightly exceed the voltage of the battery pack 132D as shown in FIG. 7B, the charge current is reduced in steps until the charge current reaches a low voltage. The charging process then continues at a low charge current until the desired target voltage is reached in each of the battery packs 132A-C. As shown in FIG. 7C, the contactor 134D of the battery pack 132D is then closed, and the charging process continues with the battery packs 132A-D.

Figure 8:
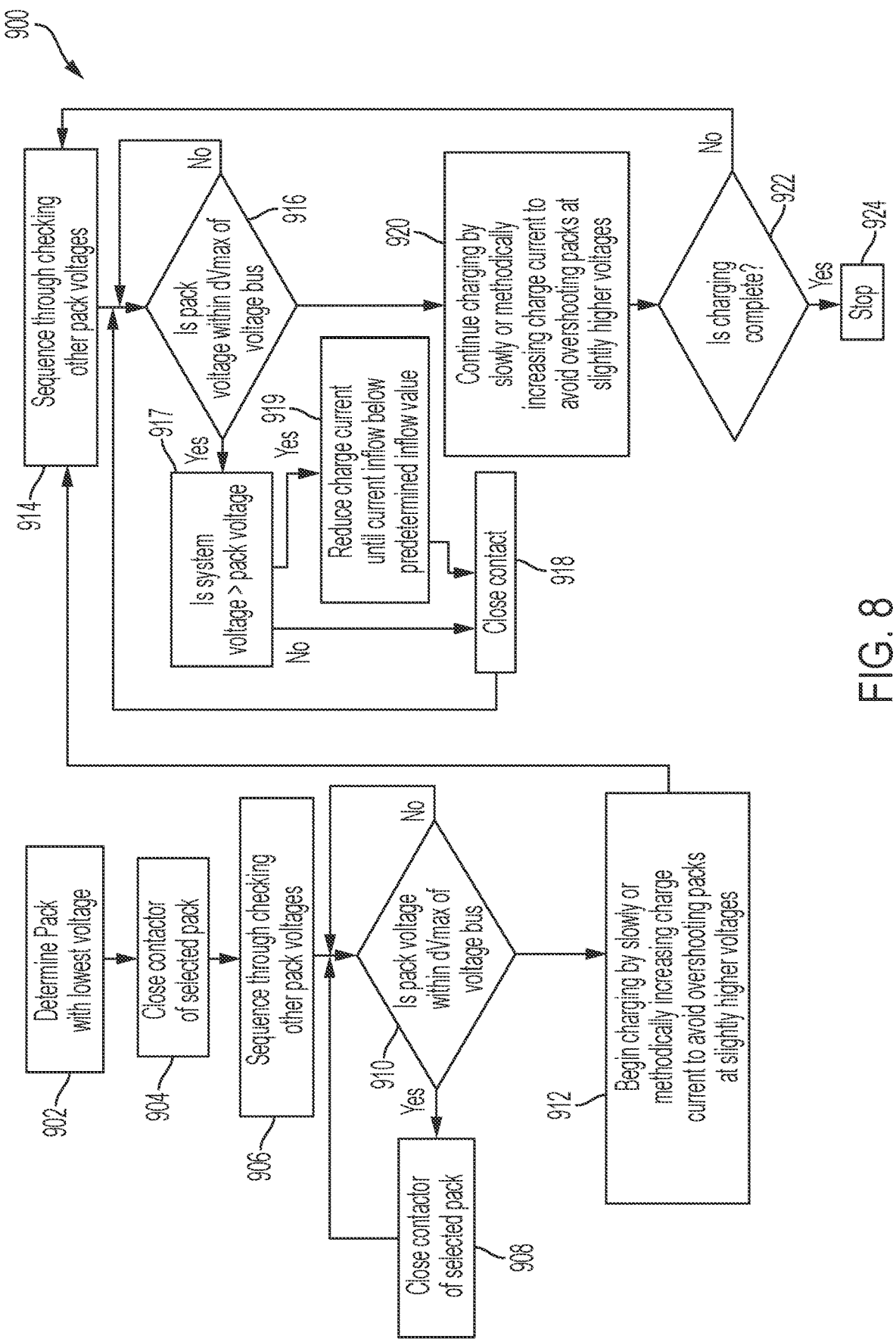
FIG. 8 is a flowchart illustrating yet another embodiment of a charging method for the parallel battery pack configuration of FIG. 1.

Referring now to FIG. 8, an alternative method 900 of charging the battery pack system 100 is shown. Method 900 is similar to the method 200 discussed above, where the difference between the methods is described further herein.

As the battery pack or battery packs selected from blocks 902 and 906-910 begin to charge at block 912, the charging process begins by slowly or methodically increasing the voltage value of the charge current to avoid overshooting any remaining packs that may have slightly higher voltages, until the charge current is at a predetermined maximum charge current value allowed by the system. After a predetermined period of time allotted for charging the selected battery pack(s) at block 912, the battery pack system 100 selects one of the remaining battery packs at block 914 and measures the voltage of the selected battery pack. In another embodiment, similar to the method 300 discussed above, the battery pack system 100 may identify and select the remaining battery pack with the lowest voltage. The absolute voltage difference between the selected battery pack and the charging battery pack(s) is calculated. The difference is then compared with a predetermined dVmax value. As shown in block 916, if the absolute voltage difference is greater than the dVmax value, the method 950 returns to block 914 to select another battery pack, if applicable. If the absolute voltage difference is less than or equal to the dVmax value, then the method 900 proceeds to block 917, where it is determined whether the system voltage, or the average measured voltage of the charging battery packs, is greater than the voltage of the selected pack. If the system voltage is greater, then the charge current is reduced at block 919 until the charge current inflow is below a predetermined inflow value. The contactors on the selected pack are then closed at block 918, and the process begins again at block 914. If the system voltage is not greater, then the contactor on the selected pack is closed at block 918 and the process begins again at block 914. The sequencing process iteratively cycles through the remaining battery packs as outlined in blocks 914, 916, 917, 919, and 918 until all the remaining battery packs in the battery pack system 100 are checked.

The method 900 then proceeds to block 920, where the selected packs and the previously charging pack(s) begin charging by slowly or methodically increasing the voltage value of the charge current to avoid overshooting any remaining packs that may have slightly higher voltages, until the charge current is at the maximum charge current value allowed by the system. After a predetermined time period of charging, the method 900 proceeds to block 922, where the battery pack system 100 determines whether charging is complete. In one embodiment, charging is complete when all of the battery packs of the battery pack system 100 are at the pre-established maximum SOC setting and the pre-established maximum voltage setting. If charging is complete, then the method 900 moves to block 924 where the method is stopped. If charging is not complete, however, the method 900 returns to block 914 to iteratively check the remaining battery packs as outlined above.

Generally, when discharging battery packs (e.g., during a drive cycle of a vehicle), battery pack(s) with the largest voltage(s) have closed contactors within the battery pack system 100 and are used first in the operation of the vehicle. As the voltage(s) of the battery pack(s) decrease during use, the voltage of the other disconnected battery pack(s), if any, are monitored to determine if the voltage of the disconnected battery pack(s) are within a voltage threshold of the discharging battery packs. Once the voltage(s) of the disconnected battery pack(s) is within a predetermined range of or substantially equal to the discharging battery pack(s), the contactors of the disconnected battery pack(s) are closed and the battery packs are used in conjunction with the prior discharging battery pack(s).

Figure 9:
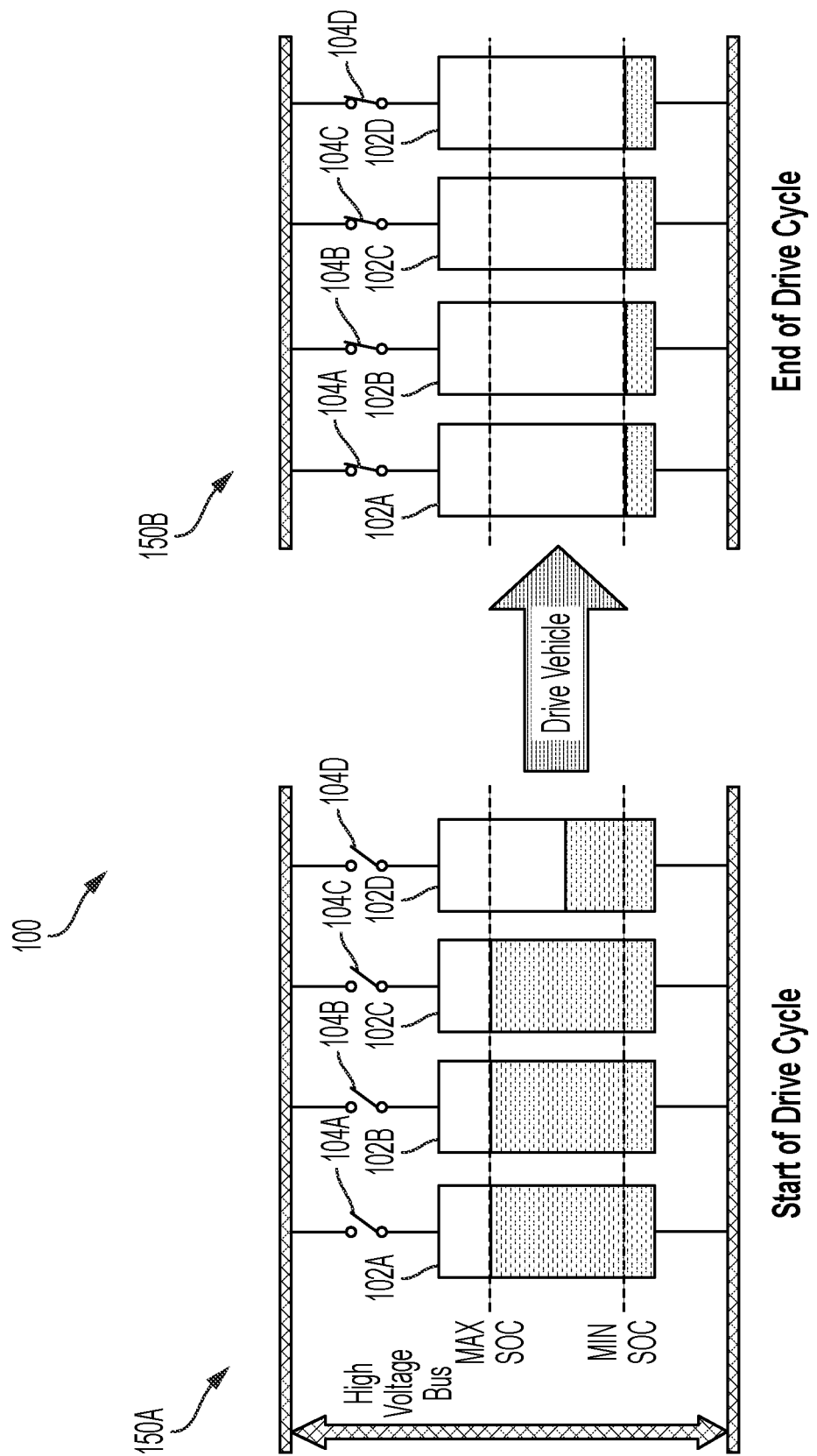
FIG. 9 is a diagram illustrating a discharging process for a parallel battery configuration.

Referring to FIG. 9, the battery pack system 100 in battery pack configurations 150A and 150B is provided. Similar to the battery pack configuration 100A, the battery pack configurations 150A and 150B include battery packs 102A-D with corresponding contactors 104A-D in the open position where the battery circuits are open and inactive (i.e., current cannot flow to or from the battery packs within the circuit). The contactors 104A-D function to switch an electrical power circuit between a closed circuit and an open circuit for the corresponding battery packs 102A-D. The battery pack configuration 150A shows an initial condition of the battery pack system 100 where the battery pack 102D has a state of charge (SOC) that is between the shown minimum SOC and the maximum SOC, while the states of charge (SOCs) of the battery packs 102A-C are substantially equal to the maximum SOC. The battery pack configuration 150A transitions to the battery pack configuration 150B when the vehicle is driven via a method disclosed further herein. The battery pack configuration 150B includes the battery packs 102A-D each having the minimum shown SOC and the contactors 104A-D in the closed position.

Figure 10:
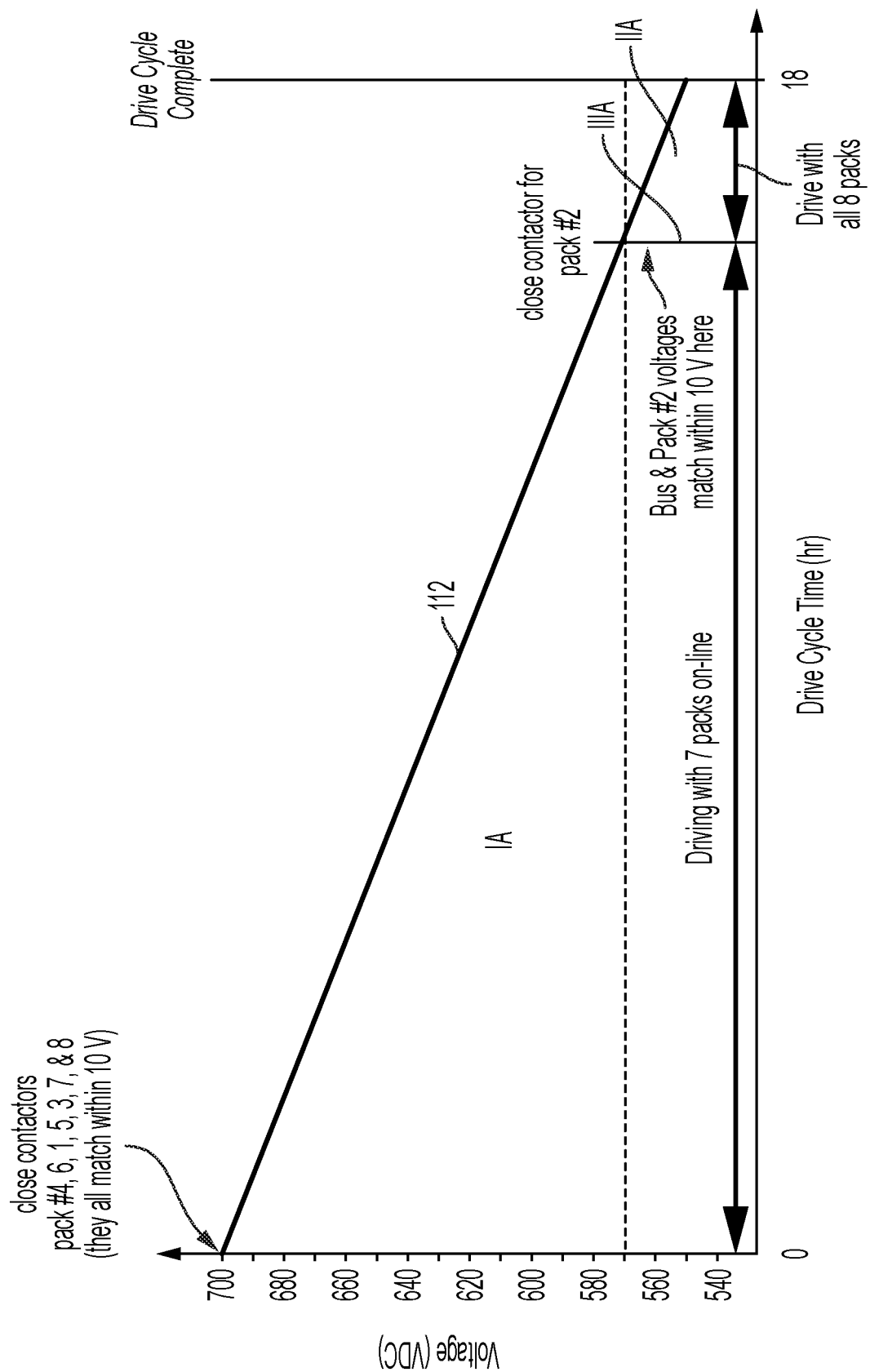
FIG. 10 is a graph illustrating embodiments of discharging methods for the parallel battery pack configuration of FIG. 1.

FIG. 10 illustrates a discharging profile 112 of a general discharging method (as discussed in greater detail herein) of an embodiment of the battery pack system 100. As shown, at time zero, battery packs #4, #6, #1, #5, #3, #7, and #8 have substantially the same voltage and are substantially greater than the voltage of battery pack #2. As such, the contactors for battery packs #4, #6, #1, #5, #3, #7, and #8 are closed and these battery packs are used during operation of the vehicle throughout region IA of FIG. 7. During use, the voltages of the battery packs diminish, and at a time denoted by IIIA, the voltage difference between battery packs #4, #6, #1, #5, #3, #7, and #8 and battery pack #2 is within a pre-determined voltage range of or substantially equal to battery packs #4, #6, #1, #5, #3, #7, and #8. The contactor for battery pack #2 is then closed thereby bringing battery pack #2 online for use during operation of the vehicle. After time IIIA, all the battery packs are used during operation of the vehicle until the drive cycle is completed.

Because the number of battery packs being discharged at any one time may vary, the electrical power and/or current between battery packs may not be constant, and therefore voltage may not fall at a constant rate as illustrated. The current and/or electrical power between battery packs will decrease at a roughly proportional rate with the number of battery packs that are online, while discharging at a constant current will see voltage decreasing at an increasing rate as additional battery packs are brought online.

Figure 11:
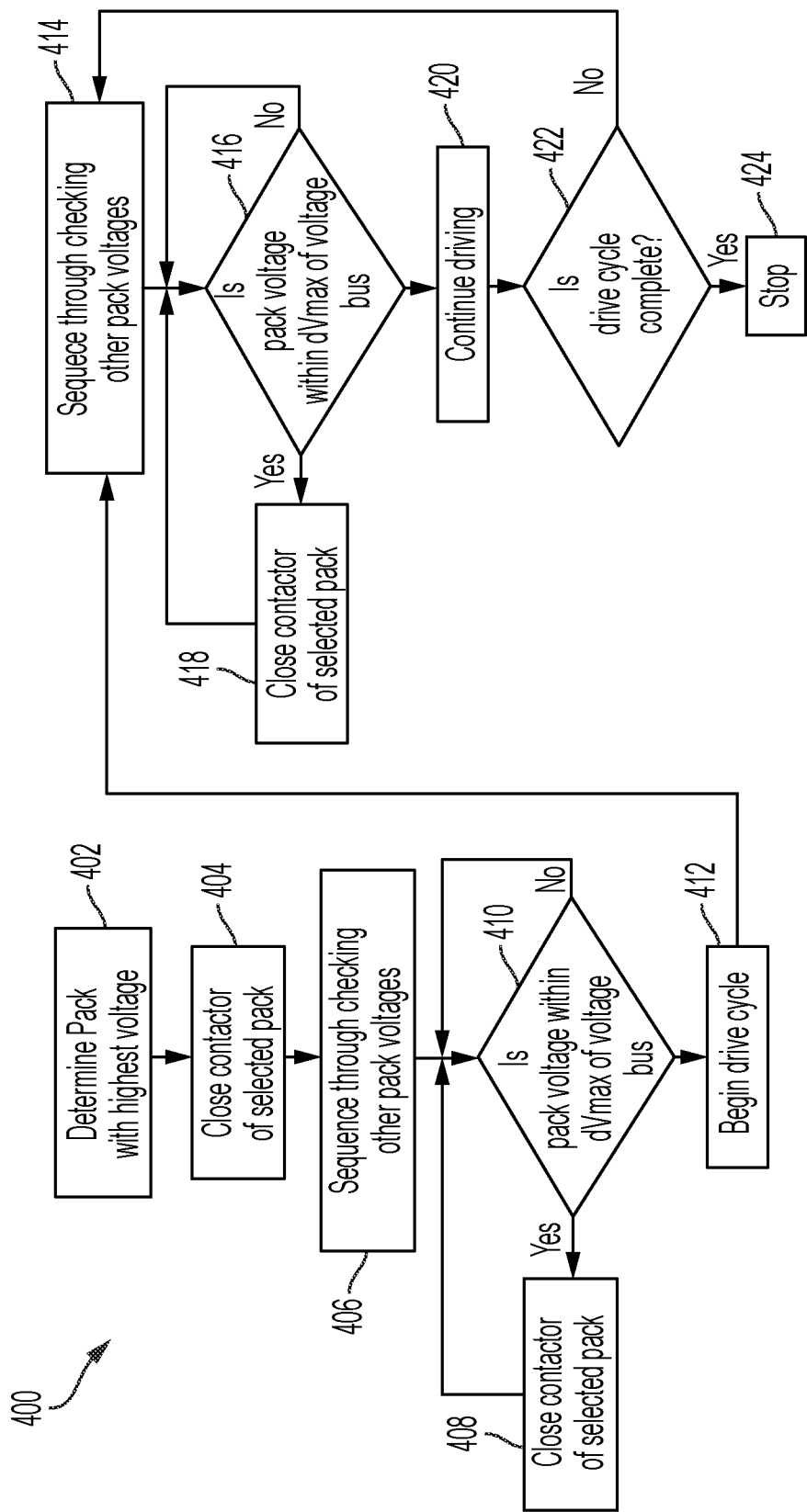
FIG. 11 is a flowchart illustrating one embodiment of a discharging method for the parallel battery pack configuration of FIG. 1.

Referring now to FIG. 11, a method 400 of discharging a battery pack system 100 is shown. The method 400 begins at block 402 where a battery pack with the highest voltage is determined and selected. Then, at block 404, a contactor of the selected pack is closed bringing the selected pack online. The method 400 then proceeds to block 406 where the battery pack system 100 iteratively checks the voltages of the other battery packs as discussed further herein.

In checking the voltages of the remaining battery packs at block 406, one of the remaining packs is selected and the voltage is measured. Then, at block 410, the voltage of the selected battery pack is compared with the voltage of the highest battery pack selected at block 402, and the absolute difference in voltage between the packs is measured and compared to the predetermined dVmax value, wherein the dVmax value is the maximum acceptable voltage differential to safely connect the battery packs. The dVmax is selected with consideration to the continuous charging current capability of the battery packs, as well as the internal resistance of the battery packs. The voltages of the respective battery packs are measured at no load and with no compensation for battery internal resistance voltage drop.

As shown in block 410, if the voltage difference is less or equal to than the dVmax value, then the method 400 proceeds to block 408 where the contactor of the selected pack is closed. The method 400 then proceeds back to block 406, where another battery pack is selected and compared with the highest voltage battery pack as outlined above. Conversely, if the absolute voltage difference between the highest voltage battery pack and the selected battery packs is greater than the dVmax value, then the method 400 returns to block 406, and another battery pack is selected and compared with the highest voltage battery pack as outlined above. It is contemplated that in alternate embodiments, the dVmax value may vary depending on the vehicle operating parameters or engine configuration. The sequencing process cycles through the remaining battery packs as outlined in blocks 406, 408, and 410 iteratively until all the battery packs in the battery pack system 100 are checked.

The method 400 then proceeds to block 412 where the drive cycle of the vehicle begins and, correspondingly, the battery packs begin to discharge. After a predetermined period of time, to allow the selected batteries to charge at block 412, the battery pack system 100 then sequences through the remaining battery packs via blocks 414, 416, and 418 in a similar iterative process as outlined above with respect to blocks 406, 408, and 410.

To check the voltages of the remaining battery packs at block 414, one of the remaining packs is selected, the voltage of the selected battery pack is compared with the voltage of the discharging battery pack(s) from block 412 at block 416, and then the absolute voltage difference between the packs is calculated and compared to the predetermined dVmax value. As shown in block 416, if the absolute voltage difference is less or equal to than the dVmax value, then the method 400 proceeds to block 418 where the contactor of the selected pack is closed. The method 400 then returns to block 414, where another battery pack is selected and compared with the voltage of the discharging battery pack(s) as outlined above. Conversely, if the absolute voltage difference between the discharging battery pack(s) and the selected battery packs is greater than the dVmax value, then the method 400 returns to block 414, and another battery pack is selected and compared with the voltage of the discharging battery pack as outlined above. It is contemplated that in alternate embodiments, the dVmax value may vary depending on the vehicle operating parameters or engine configuration. The sequencing process cycles through the remaining battery packs as outlined in blocks 414, 416, and 418 iteratively until all the battery packs in the battery pack system 100 are checked.

The method 400 then proceeds to block 420 where the selected packs in combination with the previously discharging packs are discharging or continued to discharge during the drive cycle of the vehicle. After a predetermined time period of discharging, the method 400 proceeds to block 422 where the battery pack system 100 determines whether the drive cycle of the vehicle is complete. In one embodiment, the drive cycle is complete when the drive cycle of the vehicle ends (e.g., when the mission of the vehicle is complete) or when all the battery packs of the battery pack system 100 are at the pre-established minimum SOC setting and the pre-established minimum voltage setting and are no longer capable of powering the vehicle. If the drive cycle is complete, then the method 400 moves to block 424 where the method 400 is stopped. If the drive cycle is not complete; however, the method 400 returns to block 414 to iteratively check the remaining battery packs as outlined above.

Figure 12:
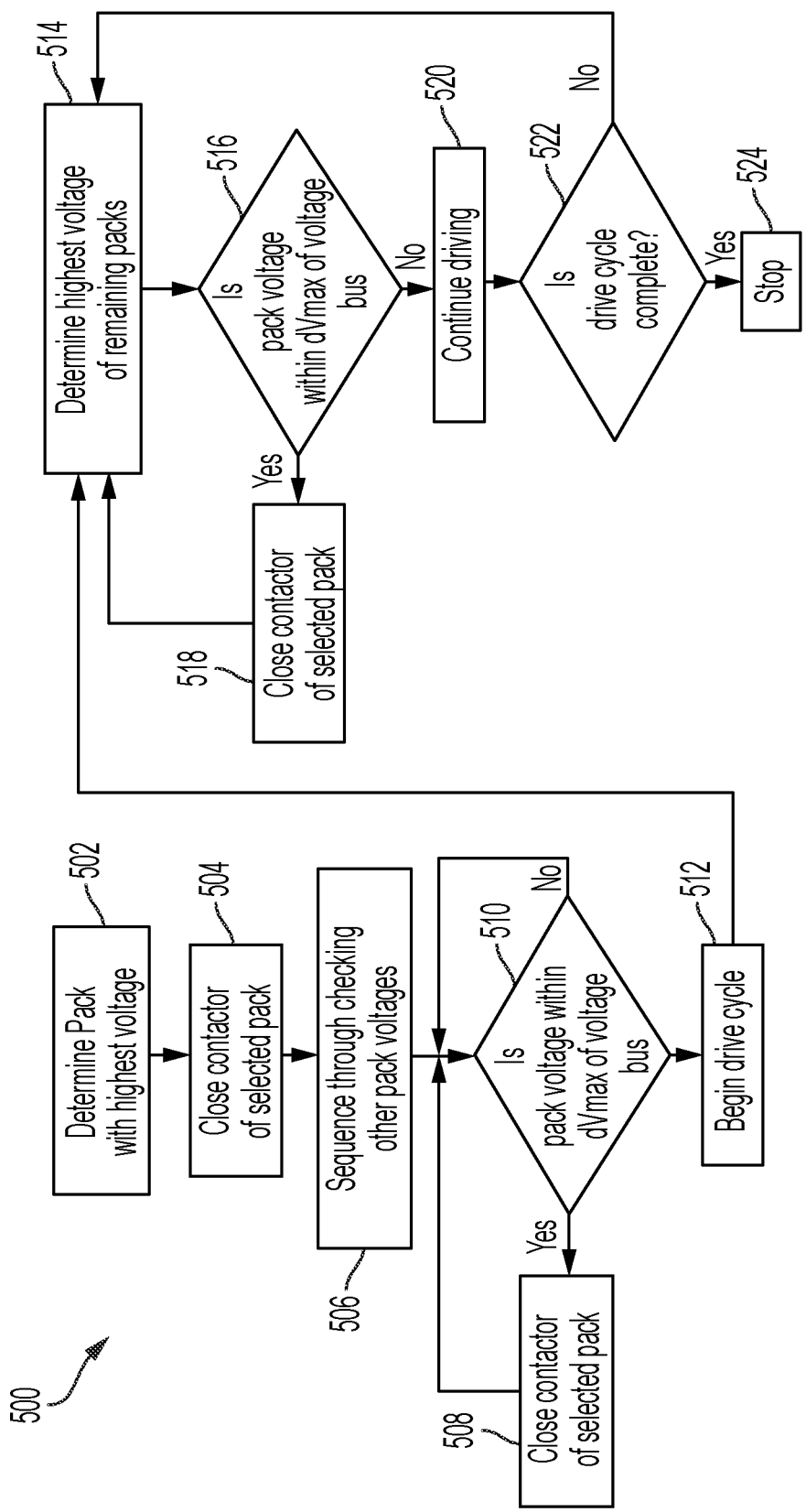
FIG. 12 is a flowchart illustrating another embodiment of a discharging method for the parallel battery pack configuration of FIG. 1.

Referring now to FIG. 12, an alternative discharging method 500 is shown. The method 500 is similar to the method 400 discussed above. The difference between the methods is described further herein.

After a predetermined amount of discharging time from when the selected batteries from blocks 506-510 begin discharging at block 512, the battery pack system 100 checks the remaining battery packs (i.e., those with open contactors) and determines the battery pack having the highest voltage. Once this is completed, the method 500 then proceeds to block 516, where similar to block 416, the voltage of the selected battery pack is compared with the voltage of the charging battery pack(s), and the absolute voltage difference is calculated. The absolute voltage difference is then compared to a predetermined dVmax value. If the absolute voltage difference is less than or equal to the dVmax value, then the contactor of the selected pack is closed at block 518, and the method 500 returns to block 514 where the battery pack with the next highest voltage is selected, if applicable. Conversely, if the absolute voltage difference between the selected battery pack and the voltage of the discharging battery pack(s) is greater than the dVmax value, then the method 500 does not close the contactor of the selected battery pack and returns to block 514 where the battery pack with the next highest voltage of the remaining battery packs is selected, and the absolute voltage difference is calculated and compared with the dVmax value as outlined above. The sequencing process iteratively cycles through the remaining battery packs as outlined in blocks 514, 516, and 518 until all the battery packs in the battery pack system 100 are checked.

After a predetermined period of time, the method 500 proceeds to block 522 where the battery pack system 100 determines whether the drive cycle is complete. As mentioned previously, the drive cycle is complete when the drive cycle of the vehicle ends (e.g., when the mission is complete) or when all of the battery packs of the battery pack system 100 are at the pre-established minimum SOC setting and the pre-established minimum voltage setting and are no longer capable of powering the vehicle. If the drive cycle is complete, then the method 500 moves to block 524 where the method 500 is stopped. If the drive cycle is not complete; however, the method 500 returns to block 514 to check the remaining battery packs as outlined above.

As discussed above in reference to FIG. 6, in some embodiments, the voltage of the batteries is measured according to a bus voltage rather than an open circuit voltage of the individual battery. In such embodiments, battery voltage may vary depending on the amount of current being discharged from the battery, and the open circuit voltage cannot be easily and accurately calculated due to a significant amount of current inflow. In such a case, when a subsequent battery pack is brought online, it will likely not be at equilibrium with a previous pack or packs which have already undergone charging, i.e. will likely have a much higher open circuit voltage that is substantially equal to the bus voltage of the previous pack or packs. Therefore, when discharging resumes, the new pack will already be at a higher potential than the previous packs, causing a disproportionate allocation of current, which may cause damage to the battery packs.

Figure 13:
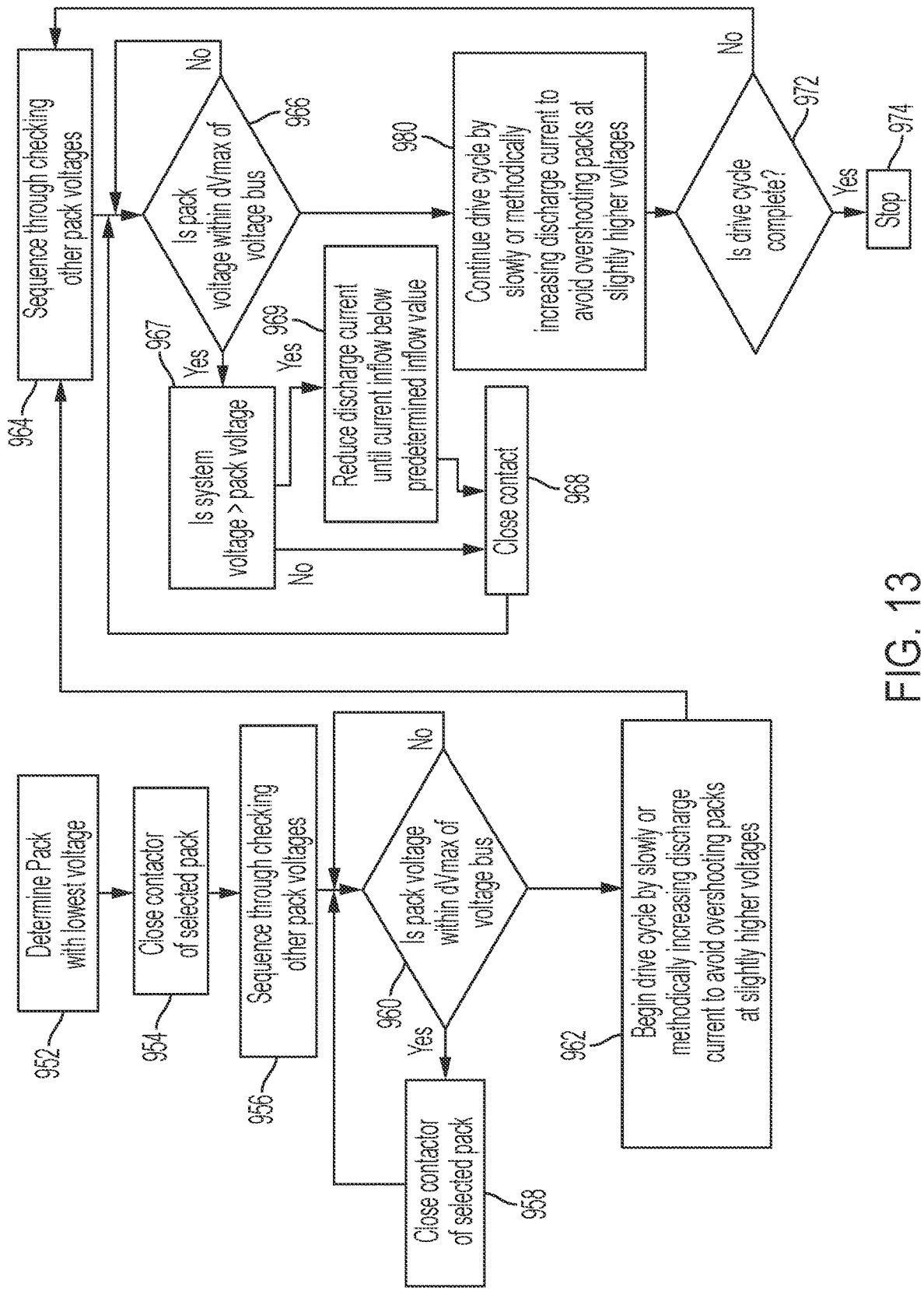
FIG. 13 is a flowchart illustrating yet another embodiment of a discharging method for the parallel battery pack configuration of FIG. 1.

Referring to FIG. 13, an alternative method 950 for discharging a battery pack system 100 is disclosed. The method 950 is similar to the method 400 described above. The difference between the methods is described further herein.

As the battery pack or battery packs selected from blocks 952 and 956-960 begin to discharge at block 962, the drive cycle of the vehicle begins, and, correspondingly, the battery packs begin to discharge, by slowly or methodically increasing the voltage value of the discharge current to avoid overshooting any remaining packs that may have slightly higher voltages, until the discharge current is at a predetermined maximum discharge current value allowed by the system. After a predetermined period of time allotted for charging the selected battery pack(s) at block 962, the battery pack system 100 selects one of the remaining battery packs at block 964 and measures the voltage of the selected battery pack. In another embodiment, similar to the method 500 discussed above, the battery pack system 100 may identify and select the remaining battery pack with the highest voltage. The absolute voltage difference between the selected battery pack and the charging battery pack(s) is calculated. The difference is then compared with a predetermined dVmax value. As shown in block 966, if the absolute voltage difference is greater than the dVmax value, then the method returns to block 964 to repeat the process with a different battery pack. If the absolute voltage difference is less than the dVmax value, then the method 950 proceeds to block 967, where it is determined whether the system voltage, or the average measured voltage of the discharging battery packs, is greater than the voltage of the selected pack. If the system voltage is greater, then the discharge current is reduced at block 969 until the discharge current inflow is below a predetermined inflow value. The contactors on the selected pack are then closed at block 968, and the selection process begins again at block 964. If the system voltage is not greater, then the contactor on the selected pack is closed at block 968 and the process begins again at block 964. The sequencing process iteratively cycles through the remaining battery packs as outlined in blocks 964, 966, 967, 969, and 968 until all the remaining battery packs in the battery pack system 100 are checked.

The method 950 then proceeds to block 970, where the drive cycle of the vehicle begins, and, correspondingly, the selected packs and the previously discharging pack(s) begin discharging by slowly or methodically increasing the voltage value of the discharge current to avoid overshooting any remaining packs that may have slightly higher voltages, until the discharge current is at the maximum discharge current value allowed by the system. After a predetermined time period of discharging, the method 950 proceeds to block 972, where the battery pack system 100 determines whether drive cycle of the vehicle is complete. In one embodiment, the drive cycle is complete when the drive cycle of the vehicle ends (e.g., when the mission of the vehicle is complete) or when all the battery packs of the battery pack system 100 are at the pre-established minimum SOC setting and the pre-established minimum voltage setting and are no longer capable of powering the vehicle. If the drive cycle is complete, then the method 950 moves to block 974 where the method 950 is stopped. If the drive cycle is not complete; however, the method 950 returns to block 964 to iteratively check the remaining battery packs as outlined above.

Figure 14:
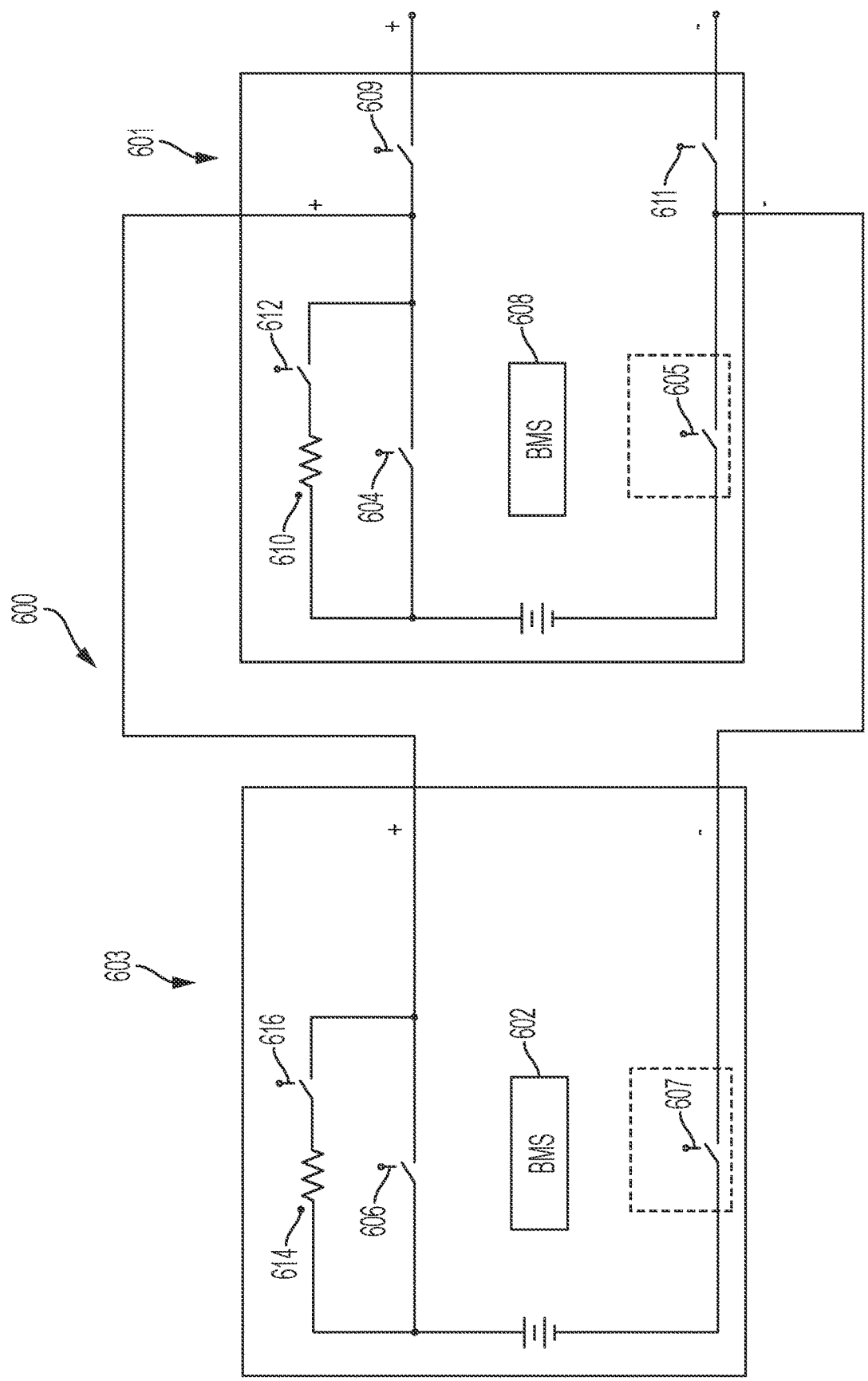
FIG. 14 is a schematic of the parallel battery configuration of the present disclosure, including a portrayal of where battery components are located within the configuration.

Referring now to FIG. 14, an alternative parallel battery configuration 600 is shown. FIG. 14 shows two battery packs 601, 603 connected in parallel. It is within the scope of the present disclosure that the configuration is applicable to multiple battery pack systems including more than two battery packs. For example, the configuration 600 may be applied to battery pack systems including four battery packs as shown in FIGS. 1, 7A-7C, and 9; eight battery packs as shown in FIGS. 2A-2B, 3, 6, and 10; or battery pack systems including any number of battery packs operable.

The battery pack 601 includes a battery management system 602 and a solid state switch, or high current contactor 604. The contactor 604 is operably connected to a resistor 610 and another solid state switch, or low current contactor 612. In a high voltage system, the battery pack 601 may optionally further include a second high current contactor 605. Similarly, the battery pack 603 includes a battery management system 608 and a solid state switch, or high current contactor 606. The contactor 606 is operably connected to a resistor 614 and another solid state switch, or low current contactor 616. In a high voltage system, the battery pack 603 may optionally further include a second high current contactor 607.

The battery pack 601 further includes a first main battery system contactor 609 positioned on a positive terminal and a second main battery system contactor 611 positioned on a negative terminal that facilitate the operative coupling of the battery pack 601 with the battery pack 603 in a parallel configuration. The main battery system contactors 609, 611 are operably coupled to the high current contactors 604, 605, 606, and 607 and the low current contactors 612 and 616 of the battery packs 601, 603. That is, when the main battery system contactors 609, 611 are closed, the high current contactors 604, 605, 606, and 607 and the low current contactors 612 and 616 are correspondingly closed, operably coupling the battery pack 601 and the battery pack 603 to each other in parallel. The main battery system contactors 609, 611 provide safety to the user by isolating high internal voltages from the external environment where such voltages could cause damage or injury. The main battery system contactors 609, 611 also provide the means by which the batteries, wired in parallel, may be connected or disconnected to fulfill the procedures discussed herein.

Figure 15:
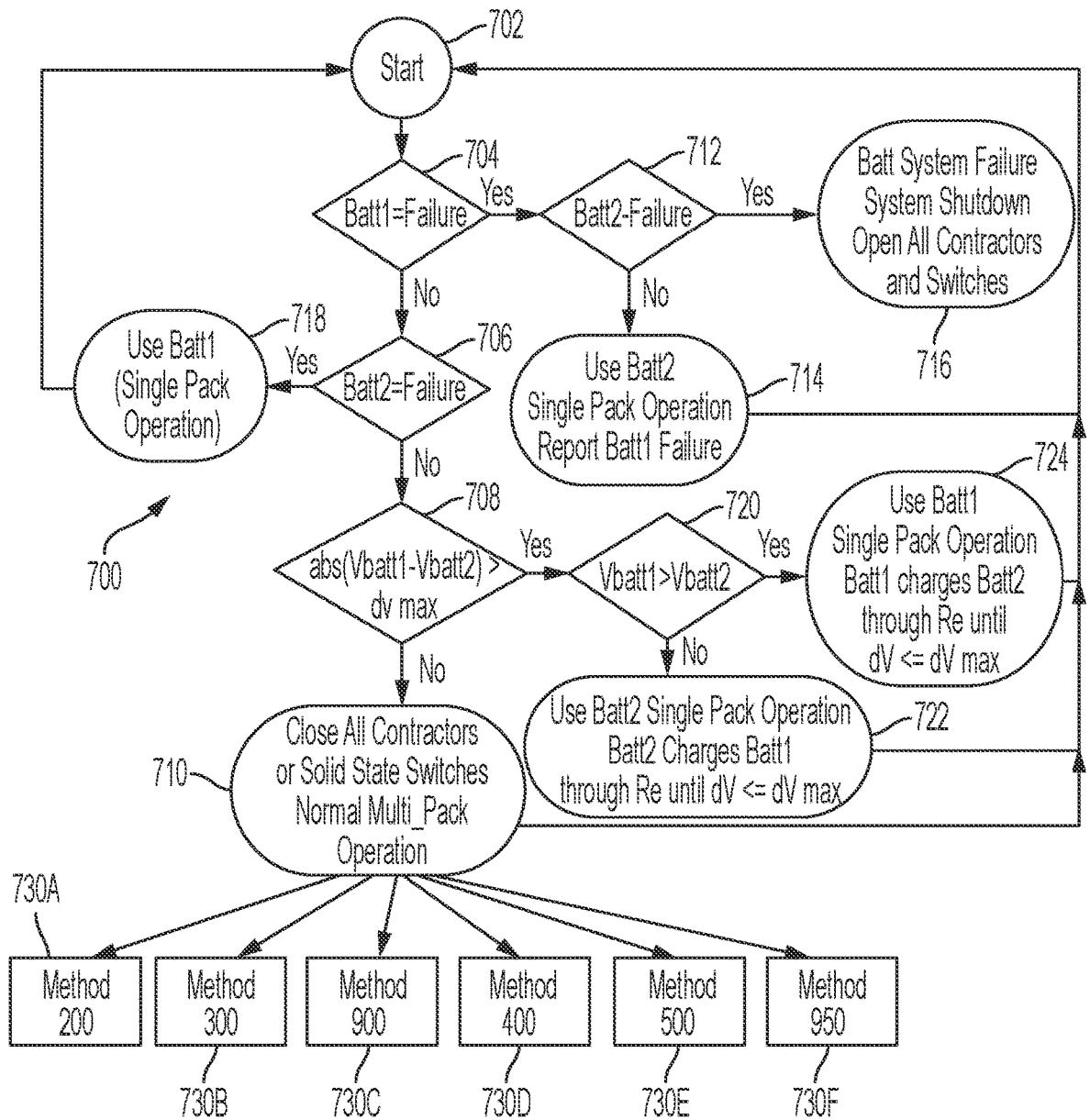
FIG. 15 is a flowchart illustrating a method for operating particular battery packs of the parallel battery configurations of FIGS. 1 and 10 depending on the respective states of the battery packs.

Referring now to FIG. 15, a method 700 to utilize battery packs without balanced voltages is disclosed. The method 700 illustratively describes a method for a system with two battery packs; however, it is within the scope of the present disclosure that the method 700 can be expanded to systems with greater than two battery packs. For example, the method 700 may be applied to battery pack systems including four battery packs as discussed above, eight battery packs as discussed above, or battery pack systems including any number of battery packs operable.

The method 700 begins at starting block 702 and moves to block 704 to assess whether a first battery pack (e.g., battery pack 601 of FIG. 14) has failed. If the first battery pack has failed, the method 700 then determines whether the second battery pack (e.g., battery pack 603) has failed at block 712. If the second battery pack has also failed, the method 700 has detected a battery pack system failure and prompts a system shutdown at block 716 in which all contactors and/or switches are opened (for example, configuration 100A or 150A of FIGS. 1 and 9, respectively). If, at block 712, the method 700 determines that the second battery pack has not failed, the system is prompted to utilize the second battery pack in a single pack operation at block 714. For example, referring to FIG. 14, the high current contactor 606 of the second battery pack 603 is closed for single pack operation, and low current contactor 612 of the first battery pack 601 is opened. The failure of the first battery pack is also reported at block 714, after which the method returns to the starting block 702 to reassess the status of the first and second battery packs.

Returning to block 704, if the method 700 determines that the first battery pack (e.g., battery pack 601 of FIG. 14) has not failed, then the method 700 proceeds to block 706 to assess whether the second battery pack (e.g., battery pack 603 of FIG. 14) has failed. If the second battery pack has failed, the system is prompted to utilize the first battery pack in a single pack operation at block 718. For example, referring to FIG. 14, the high current contactor 604 of the first battery pack 601 is closed for single pack operation, and the low current contactor 616 is opened. The method then returns to the starting block 702 to reassess the status of the first and second battery packs.

If, at block 706, the second battery pack is found to be active (i.e., has not failed), then the method 700 moves to block 708, where the voltage of the first battery pack (Vbatt1) is measured, the voltage of the second battery pack (Vbatt2) is measured, and the absolute value of the difference in voltages is calculated and compared to the predetermined dVmax value, wherein the dVmax value is the maximum acceptable voltage differential to safely connect the battery packs. The dVmax is selected with consideration to the continuous charging current capability of the battery packs, as well as the internal resistance of the battery packs. The voltages of the respective battery packs are measured at no load and with no compensation for battery internal resistance voltage drop.

If the measured absolute voltage difference is less than the predetermined dVmax value, then the method 700 moves to block 710 and all the contactors associated with the first battery pack and the second battery pack are closed and the vehicle operates under normal multi-pack pack operation according to at least one of the appropriate methods discussed above according to boxes 730A, 730B, 730C, 730D, 730E, or 730F.

However, if the measured absolute voltage difference is greater than the predetermined dVmax value, then the method 700 moves to block 720 to determine whether the voltage of the first battery pack is greater than the voltage of the second battery pack. If the voltage of the first battery pack is greater than the voltage of the second battery pack, then the method 700 moves to block 724 where the vehicles operates with the first battery pack as the single operational battery pack. For example, referring to FIG. 10, the high current contactor 604 of the first battery pack 601 is closed for operation of the first battery pack 601, and the low current contactor 616 of the second battery pack 603 is closed to close the charging circuit, enabling charging of the second battery pack 603 during operation of the first battery pack 601. The first battery pack 601 charges the second battery pack 603 through the resistor 614 until the voltage differential between the first battery pack 601 and the second battery pack 603 is less than or equal to the predetermined dVmax value, after which the method 700 returns to starting block 702 to reassess the status of the first and second battery packs.

If the voltage of the first battery pack is not greater than the voltage of the second battery pack (i.e., the voltage of the second battery pack is greater), then the method 700 moves to block 722 where the vehicles operates with the second battery pack as the single operational battery pack. For example, referring to FIG. 10, the high current contactor 606 of the second battery pack 603 is closed for operation of the second battery pack 603, and the low current contactor 612 of the first battery pack 601 is closed to close the charging circuit, enabling charging of the first battery pack 601 during operation of the second battery pack 601. The second battery pack 603 charges the first battery pack 601 through the resistor 610 until the voltage differential between the first battery pack 601 and the second battery pack 603 is less than or equal to the predetermined dVmax value, after which the method 700 returns to starting block 702 to reassess the status of the first and second battery packs.

The method 700 enhances the safety of the system by providing full redundancies such that batteries of great imbalance are not fully activated within the system. In general, when the difference in voltage between the batteries is large (greater than a predetermined voltage threshold), the lower voltage battery pack is inactive for operation of the vehicle but is actively charged until the difference in voltage is reduced below the predetermined voltage threshold. In this way, vehicles can continue their mission even when some battery packs in a multi-pack system are not online, as the offline battery pack is disconnected by static or solid switches and/or contactors.

Figure 16:
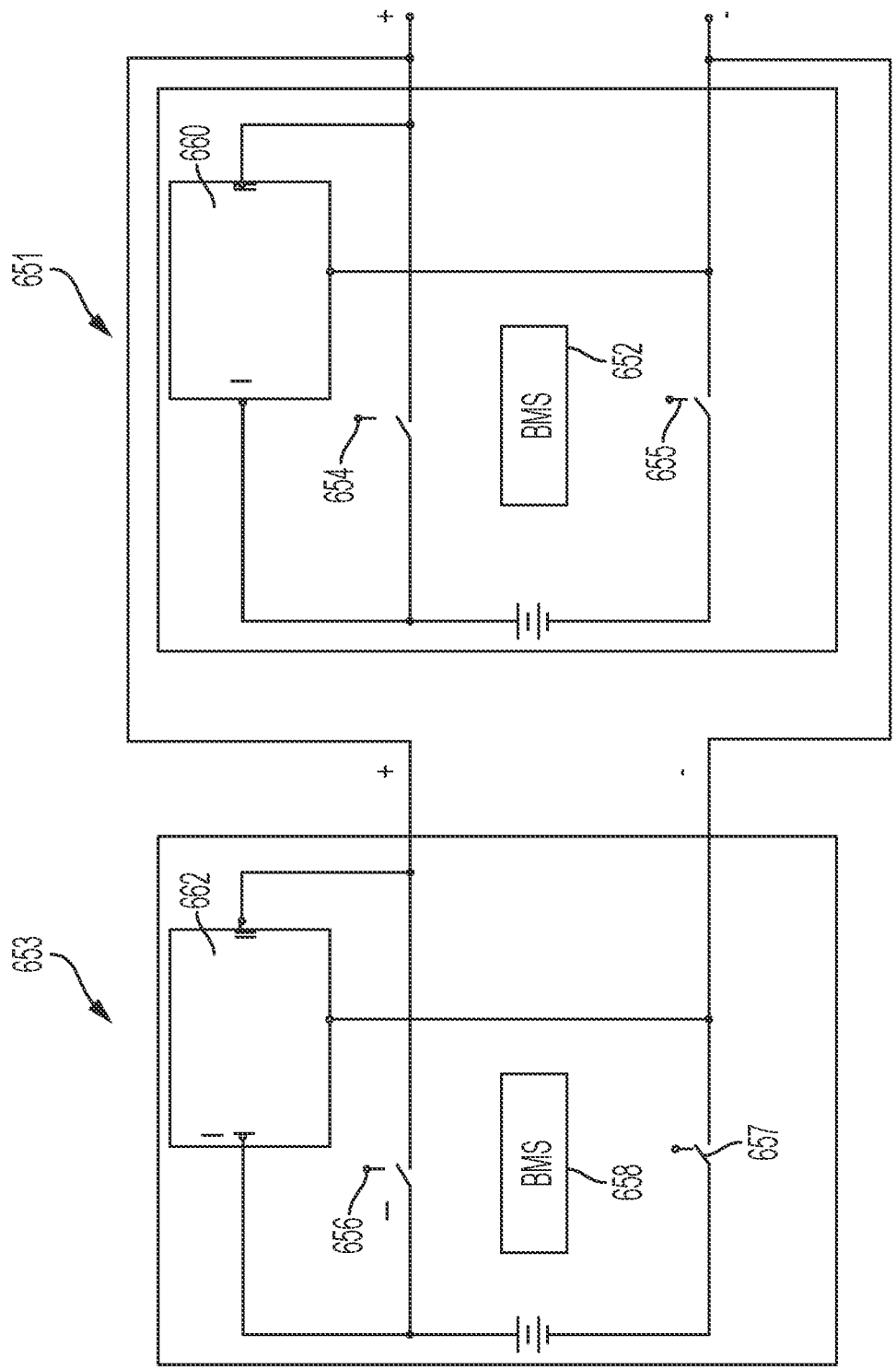
FIG. 16 is a schematic of another embodiment of the parallel battery configuration of the present disclosure.

Referring now to FIG. 16, an alternate battery configuration 800 for connecting two battery packs 651, 653 in parallel is shown; however, it is within the scope of the present disclosure that the configuration 800 can be expanded to systems with greater than two battery packs. For example, the configuration 800 may be applied to battery pack systems including four battery packs as discussed herein, eight battery packs as discussed herein, or battery pack systems including any number of battery packs operable.

The first battery pack 651 includes a battery management system 652 and a solid state switch, or contactor 654 installed on a positive terminal and operably coupled to a converter 660. A second solid state switch, or contactor 655 is installed on a negative terminal. This configuration provides a safety measure in case one of the contactors fails while it is in the closed position, relative to the battery pack 651. In such a case, a user can still isolate the battery by opening the other contactor, preventing completion of the circuit. The second battery pack 653 also includes a battery management system 658 and a solid state switch, or contactor 656 installed on a positive terminal and operably coupled to a converter 662. A second solid state switch, or contactor 657 is installed on a negative terminal, providing the same safety measure discussed above.

In the illustrated embodiment, each of the converters 660 and 662 comprise a buck boost converter; however, it is within the scope of the present disclosure that alternate converters may be used. Each of the converters 660 and 662 are configured to balance voltages between the first battery pack 651 and the second battery pack 653. For example, when the positive terminal contactor 654 of the first battery pack 651 is open, the converter 660 operates in place of the resistor 610 discussed above in relation to the first battery pack 601 of FIG. 14. The converter 660 may transfer a fraction of the total battery pack current to balance the first battery pack 651 and the second battery pack 653. Similarly, when positive terminal connector 656 of the second battery pack 653 is open, the converter 662 operates in place of the resistor 614 discussed above in relation to the first battery pack 603 of FIG. 14. The converter 662 may transfer a fraction of the total battery pack current to balance the first battery pack 651 and the second battery pack 653.

The converter 660 of the first battery pack 651 may draw an input voltage from the first battery pack 651 and output a different voltage that is controlled to match the voltage of the second battery pack 653. Similarly, the converter 662 of the second battery pack 653 may draw an input voltage from the second battery pack 653 and output a different voltage that is controlled to match the voltage of the first battery pack 651. If the output voltage is greater than the input voltage, then the corresponding converter 660 or 662 is in a "boost" state. Conversely, if the output voltage is less than the input voltage, the corresponding converter 660 or 662 is in a "buck" state. The illustrative buck boost converters comprising converters 660 and 662 may output voltages that are greater than or less than the input voltage depending on the need of the vehicle. The converters 660 and 662 may also modulate current flow between the battery packs such that the battery packs are within operable operating limits.

Figure 17:
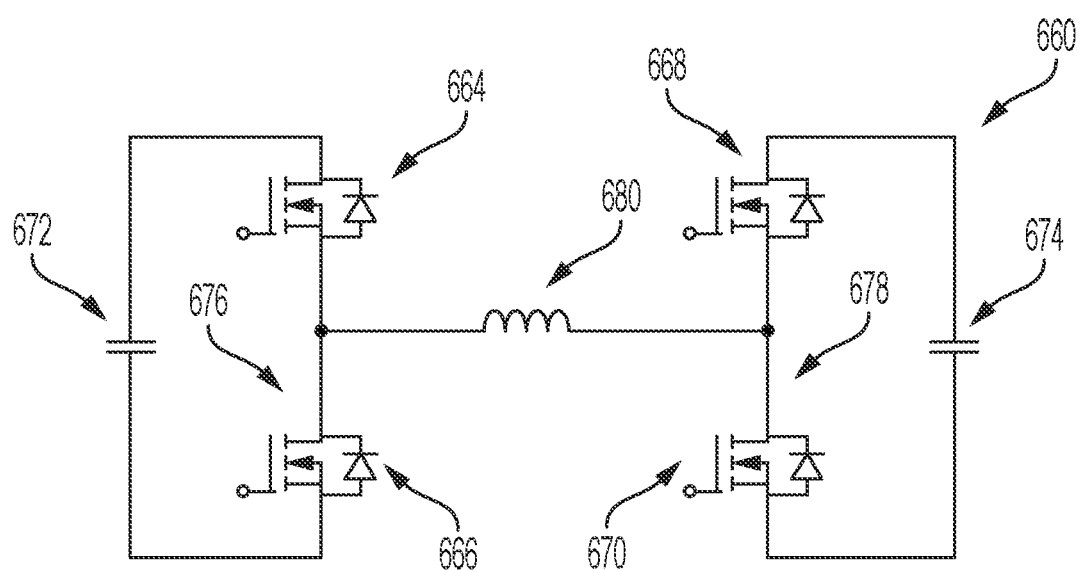
FIG. 17 is a schematic of the converter used in FIG. 12.

Now referring to FIG. 17, an embodiment of a buck-boost converter 660 is shown. It is within the scope of the present disclosure that FIG. 17 also discloses the components of the converter 662 (FIG. 16). As shown in FIG. 17, a four-switch topology is used with switches 664, 666, 668, and 670. In the illustrated embodiment, switches 664 and 666 make up a first pair 665 and switches 668 and 670 make up a second pair 669. However, it is contemplated that in alternate embodiments, other topologies may be used. As further shown, batteries 672 and 674 are connected at opposite ends of the converter 660. Each of the batteries 672 and 674 is connected to one of the pairs of power electronic switches 665, 669 connected in series across the batteries 672, 674, respectively (otherwise known as half-bridges 676, 678 as shown in FIG. 17). Each of the pairs of switches 665, 669 comprise a semiconductor transistor and an anti-parallel diode. The semiconductor transistor permits current flow from the top terminal of the switch to the bottom terminal of the switch when turned ON, and the anti-parallel diode permits current flow from the bottom terminal of the switch to the top terminal of the switch whenever the diode is forward biased. Further, the mid-points of half-bridges 676, 678 are connected via an inductor 680.

The operation of the switches 664, 666, 668, and 670 is coordinated by a digital or analog controller to facilitate controlled energy flow from either battery 672, 674 to the other, irrespective of whether the voltage difference is positive or not. The inductor 680 is utilized as an energy storage device, and the controller alternates the buck boost converter 660 between circuit operating modes where in a first mode, the inductor 680 is charged by one of the voltage sources/batteries 672, 674 by turning on two switches positioned diagonally from each other (e.g., switches 664 and 670 or 666 and 668) with the remaining two switches turned off, and discharges into the other voltage source/battery 672, 674 to provide the desired direction of current or energy flow. In a second mode, the inductor 680 is charged by the other voltage source/battery 672, 674 by turning on the other two switches positioned diagonally from each other (e.g., switches 664 and 670 or 666 and 668) with the remaining two switches turned off and discharges into the other voltage source/battery to provide the desired direction of current or energy flow. Advantageously, the configurations shown in FIGS. 16 and 17 reduce power losses during battery pack balancing or pre-charging.

While the invention has been described by reference to various specific embodiments it should be understood that numerous changes may be made within the spirit and scope of the inventive concepts described, accordingly, it is intended that the invention not be limited to the described embodiments but will have full scope defined by the language of the following claims.

What is claimed is:

1. A method of charging a plurality of battery packs, comprising:
    identifying a first battery pack having a lowest voltage of a plurality of battery packs;
    closing a first contactor of the first battery pack;
    measuring a second voltage of a second battery pack of the plurality of battery packs;
    determining a first difference between the lowest voltage and the second voltage;
    comparing the first difference to a predetermined maximum acceptable voltage differential (dVmax) value; and
    charging the first battery pack with the first closed contactor by methodically increasing a voltage value of a provided charge current until the charge current reaches a predetermined maximum charge current value.

2. The method of claim 1, wherein the first difference is less than or equal to the dVmax value and further comprising closing a second contactor of the second battery pack.

3. The method of claim 1, further comprising:
    allowing a first predetermined amount of time to pass;
    measuring a third voltage of the first battery pack;
    measuring a fourth voltage of a battery pack of the plurality of battery packs;
    determining a second difference between the fourth voltage and the third voltage; and
    comparing the second difference to a predetermined voltage value.

4. The method of claim 3, further comprising closing a third contactor of the battery pack having the fourth voltage of the plurality of battery packs, wherein the second difference is less than or equal to the predetermined voltage value.

5. The method of claim 3, wherein the first difference is greater than the dVmax value and the second battery pack and the battery pack having the fourth voltage of the plurality of battery packs are the same battery pack.

6. The method of claim 3, wherein the battery pack having the fourth voltage of the plurality of battery packs comprises the lowest voltage of the remaining plurality of battery packs.

7. A method of discharging a plurality of battery packs, comprising:
    identifying a first battery pack having a highest voltage of a plurality of battery packs;
    closing a first contactor of the first battery pack;
    measuring a second voltage of a second battery pack of the plurality of battery packs;
    determining a first difference between the highest voltage and the second voltage;
    comparing the first difference to a predetermined maximum acceptable voltage differential (dVmax) value;
    discharging the first battery pack with the first closed contactor by methodically increasing a voltage value of a provided discharge current until the voltage value of the discharge current reaches a predetermined maximum discharge current value.

8. The method of claim 7, wherein the first difference is less than or equal to the dVmax value and further comprising closing a second contactor of the second battery pack.

9. The method of claim 7, further comprising:
    allowing a first predetermined amount of time to pass;
    measuring a third voltage of the first battery pack;
    measuring a fourth voltage of a third battery pack of the remaining plurality of battery packs;
    determining a second difference between the fourth voltage and the third voltage; and
    comparing the second difference to a predetermined voltage value.

10. The method of claim 9, further comprising closing a third contactor of the battery pack having the fourth voltage of the plurality of battery packs, wherein the second difference is less than or equal to the predetermined voltage value.

11. The method of claim 9, wherein the first difference is greater than the dVmax value and the second battery pack and the battery pack having the fourth voltage of the plurality of battery packs are the same battery pack.

12. The method of claim 9, wherein the battery pack having the fourth voltage of the plurality of battery packs comprises the highest voltage of the remaining plurality of battery packs.

13. A method of changing voltage of a plurality of battery packs, comprising:
    providing a charge current or a discharge current to at least a first battery pack of a plurality of battery packs, wherein the first battery pack includes a closed first contactor, by methodically increasing a voltage value of the charge current or the discharge current until the voltage value reaches a predetermined maximum current voltage value;
    measuring a first voltage of the first battery pack;
    measuring a second voltage of a second battery pack of the plurality of battery packs;
    determining a first difference between the first voltage and the second voltage;
    comparing the first difference to a predetermined maximum acceptable voltage differential (dVmax) value;
    comparing the second voltage of the second battery pack to a system voltage.

14. The method of claim 13, further comprising:
    reducing the voltage value of the charge current or the discharge current until a current inflow is less than a predetermined inflow value; and
    closing a second contactor of the second battery pack;
    wherein the first difference is less than or equal to the dVmax value and the system voltage is greater than the second voltage.

15. The method of claim 13, further comprising closing a second contactor of the second battery pack wherein the first difference is less than or equal to the dVmax value and the system voltage is less than or equal to the second voltage.

16. The method of claim 13, wherein the second battery pack comprises the lowest voltage of the remaining plurality of battery packs.

17. The method of claim 13, wherein the second battery pack comprises the highest voltage of the remaining plurality of battery packs.

18. The method of claim 13, further comprising charging the battery packs with closed contactors.

19. The method of claim 13, comprising discharging the battery packs with closed contactors.

20. A method of changing voltage of a plurality of battery packs, comprising:

provide a charge current or a discharge current to at least a first battery pack of a plurality of battery packs, wherein the first battery pack includes a closed first contactor;

measuring a first voltage of the first battery pack;

measuring a second voltage of a second battery pack of the plurality of battery packs;

determining a first difference between the first voltage and the second voltage;

comparing the first difference to a predetermined maximum acceptable voltage differential (dVmax) value;

comparing the second voltage of the second battery pack to a system voltage;

reducing the voltage value of the charge current or the discharge current until a current inflow is less than a predetermined inflow value; and closing a second contactor of the second battery pack;

wherein the first difference is less than or equal to the dVmax value and the system voltage is greater than the second voltage.

* * * * *